US007142624B2

(12) United States Patent
Cranford, Jr. et al.

(10) Patent No.: US 7,142,624 B2
(45) Date of Patent: *Nov. 28, 2006

(54) ANALOG UNIDIRECTIONAL SERIAL LINK ARCHITECTURE

(75) Inventors: Hayden Clavie Cranford, Jr., Apex, NC (US); Stacy Jean Garvin, Durham, NC (US); Vernon Roberts Norman, Cary, NC (US); Paul Alan Owczarski, Raleigh, NC (US); Martin Leo Schmatz, Gallen (CH); Joseph Marsh Stevens, Morrisville, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/225,600

(22) Filed: Sep. 13, 2005

(65) Prior Publication Data
US 2006/0008042 A1    Jan. 12, 2006

Related U.S. Application Data

(63) Continuation of application No. 09/996,053, filed on Nov. 28, 2001, now Pat. No. 6,993,107.

(60) Provisional application No. 60/262,441, filed on Jan. 16, 2001.

(51) Int. Cl.
  *H03D 3/24*    (2006.01)
(52) U.S. Cl. ........................... 375/376; 327/156
(58) Field of Classification Search ............... 375/371, 375/373, 374, 375, 376; 327/156, 147, 148, 327/157
See application file for complete search history.

(56) References Cited

U.S. PATENT DOCUMENTS

| 4,918,393 | A | * | 4/1990 | Yokosuka et al. | 329/318 |
|---|---|---|---|---|---|
| 5,276,661 | A | * | 1/1994 | Beg | 368/155 |
| 5,475,707 | A | * | 12/1995 | Ficarra et al. | 375/141 |
| 5,621,755 | A | | 4/1997 | Bella et al. | 375/219 |
| 5,719,867 | A | * | 2/1998 | Borazjani | 370/436 |
| 5,799,048 | A | | 8/1998 | Farjad-Rad et al. | 375/360 |
| 5,812,594 | A | | 9/1998 | Rakib | 375/219 |
| 5,825,813 | A | * | 10/1998 | Na | 375/219 |

(Continued)

FOREIGN PATENT DOCUMENTS

DE    3707761    9/1988

(Continued)

OTHER PUBLICATIONS

Dossier CH919960004, "Receiving and Equalizing Signals for High-Speed Data Transmission", pp. 1-7.

(Continued)

*Primary Examiner*—Jean B. Corrielus
(74) *Attorney, Agent, or Firm*—Joscelyn G. Cockburn; Patrick J. Daugherty; Driggs, Hogg & Fry Co., Ltd.

(57) ABSTRACT

The present analog invention is related to a unified digital architecture comprising logic transmitter portions and logic receiver portions. A unified serial link system and method for transmitting digital data across wired media including a transmitter and a receiver portion is provided, one of the transmitter portion and receiver portion comprising a phase locked loop (PLL) circuit. The PLL circuit comprises a voltage control oscillator, a frequency divider, a phase-frequency detector, a charge pump and a multi-pole loop filter. One embodiment comprises a dual loop PLL having a digital coarse loop and an analog fine loop.

16 Claims, 30 Drawing Sheets

U.S. PATENT DOCUMENTS

| | | | | |
|---|---|---|---|---|
| 5,930,231 | A * | 7/1999 | Miller et al. | 370/210 |
| 6,002,717 | A * | 12/1999 | Gaudet | 375/232 |
| 6,018,275 | A * | 1/2000 | Perrett et al. | 332/127 |
| 6,029,324 | A * | 2/2000 | Wixforth | 257/416 |
| 6,144,708 | A | 11/2000 | Maruyama | 375/327 |
| 6,150,890 | A * | 11/2000 | Damgaard et al. | 331/14 |
| 6,160,432 | A * | 12/2000 | Rhee et al. | 327/157 |
| 6,236,267 | B1 * | 5/2001 | Anzil | 330/149 |
| 6,347,126 | B1 * | 2/2002 | Nagayasu et al. | 375/344 |
| 6,389,273 | B1 * | 5/2002 | Brandenburg | 455/296 |
| 6,424,192 | B1 * | 7/2002 | Lee et al. | 327/156 |
| 6,462,594 | B1 * | 10/2002 | Robinson et al. | 327/159 |
| 6,480,704 | B1 * | 11/2002 | Pakonen | 455/126 |
| 6,522,702 | B1 * | 2/2003 | Maruyama | 375/324 |
| 6,614,840 | B1 * | 9/2003 | Maruyama | 375/232 |
| 6,624,668 | B1 * | 9/2003 | Robinson et al. | 327/103 |
| 6,643,787 | B1 * | 11/2003 | Zerbe et al. | 713/400 |
| 6,650,720 | B1 * | 11/2003 | Grung et al. | 375/375 |
| 6,975,687 | B1 * | 12/2005 | Jackson et al. | 375/297 |
| 2002/0041581 | A1 * | 4/2002 | Aramaki | 370/335 |
| 2003/0001692 | A1 * | 1/2003 | Chiu et al. | 333/164 |
| 2004/0076192 | A1 * | 4/2004 | Zerbe et al. | 370/516 |
| 2004/0098634 | A1 * | 5/2004 | Zerbe et al. | 713/500 |
| 2004/0190669 | A1 * | 9/2004 | Gutierrez et al. | 375/376 |

FOREIGN PATENT DOCUMENTS

| | | |
|---|---|---|
| DE | 4411876 | 10/1994 |
| JP | 2000069102 A | 3/2000 |

OTHER PUBLICATIONS

"Analog Integrated Circuits and Signal Processing", Routama et al, vol. 19, No. 1, Apr, 1999, Kluwer Academic Publishers, pp. 59-74.

"Unilink 2.5 Gigabit SerDes Core" Product Brief, Routama et al, Analog Integrated Circuits and Signal Processing, Kluwer Academic Publishers, vol. 19, No. 1, Apr, 1999, p. 1.

"Building on our strength for success", IBM InfiniBand Products, Feb. 15, 2001, pp. 1-2.

International Search Report dated Oct. 6, 2002 re Application No. PCT/GB 02/00143 filed Jan. 15, 2002.

* cited by examiner

| FIG. 18A | FIG. 18B |

Eight stage ring oscillator with attached FIR filter

Rotation by one phase slice in four steps (a) to (d)

ANALOG UNIDIRECTIONAL SERIAL LINK ARCHITECTURE

RELATED APPLICATIONS

This application is a continuation of application Ser. No. 09/996,053, filed Nov. 28, 2001, now U.S. Pat. No. 6,993,107 B2, issued Jan. 31, 2006, which claims the benefits of provisional patent application Ser. No. 60/262,441, filed Jan. 16, 2001, for "Unilink Analog Architecture".

This application is related to the following copending applications, all of which are incorporated herein by reference: Ser. No. 09/996,113, filed Nov. 28,2001, for "Unified Digital Architecture", now Pat. Ser. No. 6,970,529 B2. issued Nov, 29, 2005; Ser. No. 09/996,091, filed Nov. 28,2001, for "GLOBAL ARCHITECTURE FOR ADVANCED SERIAL LiNK" ; Ser. No. 09/997,587, filed Nov. 28, 2001, for "Apparatus And Method For Oversampling With Evenly Spaced Samples" ; Ser. No. 09/749,908, filed Dec. 29,2000, for "Programmable Driver/Equalizer with Alterable Analog Finite Impulse Response (FIR) Filter Having Low Intersymbol Interference & Constant Peak Amplitude Independent of Coefficient Settings" ; and Ser. No. 09/861,668, filed May 22,2001, by Schmatz for "Phase Rotator and Data Recovery Receiver Incorporating said Phase Rotator."

FIELD OF THE INVENTION

The present invention relates to a unidirectional serial link across wired media, such as a chip-to-chip or a card-to-card interconnect comprising an analog transmitter portion and an analog receiver portion.

BACKGROUND OF THE INVENTION

Serial data must be transmitted across wired media The transmit and receive sections include chips wired to one another and card-to-card interconnects. The transmission media can be a combination of printed circuit board, connectors, backplane wiring, fiber or cable. The interconnect can include its own power, data and clocking sources or may derive these functions from a host module. Such data has typically been transmitted through a parallel data bus, such as ISA, PCI, PCI-X and the like. One drawback of such parallel links is the moderate rate of data transmission due to improved microprocessor performance, resulting in data transfer bandwidths that typically outpace I/O transfer rates. Also, the ASIC I/O count is high. In addition, the system integration I/O count using a parallel data bus is high. Finally, the overall system cost associated with the use of the parallel data bus tends to be high.

Related art shows attempts to overcome these difficulties and drawbacks by utilizing serial communication systems involving a variety of schemes. For example, some have used a carrier-less amplitude/phase (CAP) modulation scheme. Others have used a linear compression/decompression and digital signal processing techniques for frequency modulation. Still others use a linear (analog) phase rotator to recover only the carrier of an incoming signal. Some transmit using a pass band, which limits the bandwidth of the frequencies being passed, rather than a baseband channel wherein the signals are not shared and the frequencies are not restricted.

BRIEF DESCRIPTION OF THE INVENTION

The present analog invention is related to a unified digital architecture comprising logic transmitter portions and logic receiver portions. A unified serial link system and method for transmitting digital data across wired media including a transmitter and a receiver portion is provided, one of the transmitter portion and receiver portion comprising a phase locked loop (PLL) circuit. The PLL circuit comprises a voltage control oscillator, a frequency divider, a phase-frequency detector, a charge pump and a multi-pole loop filter. One embodiment comprises a dual loop PLL having a digital coarse loop and an analog fine loop.

The unified digital architecture is described more fully in incorporated related applications. One embodiment of the unified digital architecture described in the incorporated applications comprises a logic transmitter portion containing a phase locked loop (PLL), a di-bit data register, a finite impulse response (FIR) filter and a transmit data register. Said unified digital architecture also comprises a Pseudo-Random Bit Stream (PRBS) generator and a checker. The digital receiver portion contains a PLL, an FIR phase rotator and a phase rotator control state machine, and a clock buffer, and may also include a Pseudo-Random Bit Stream (PRBS) generator and a checker for diagnostics.

BRIEF DESCRIPTION OF THE DRAWINGS

FIG. 14, is a block diagram of the topography of a phase rotator and phase buffer according to the present invention.

DETAILED DESCRIPTION OF THE INVENTION

Figure 1:
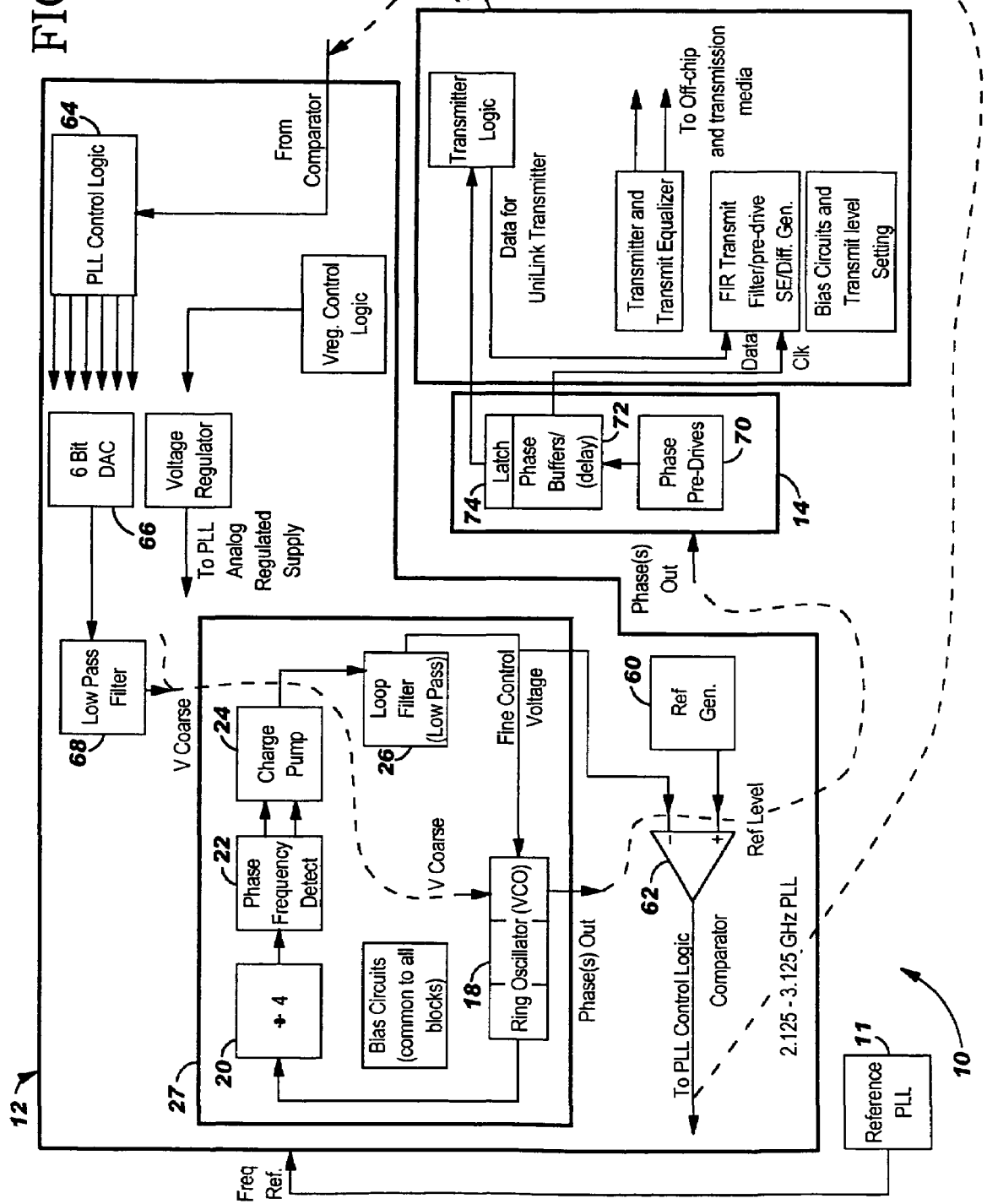
FIG. 1 is a block diagram of the transmitter architecture of the present invention.

Referring now to FIG. 1, a block diagram of the transmitter analog architecture 10 of the present invention is shown. The transmitter architecture 10 is supported by three major analog blocks: a full data rate phase locked loop (PLL) 12, a Phase Buffer circuit 14 to repower the PLL signal, and an off-chip Finite Impulse Response (FIR) equalization driver circuit 16. Within the PLL 12 are a "fine" control loop circuit 27 and a "coarse" control loop.

The transmitter PLL 12 is the clock source for the transmitted data and preferably runs at the full data rate. At full rate, less duty cycle distortion and jitter occur, and the present embodiment of the invention is able to run at full rate efficiently. A frequency reference is 1/nth target data rate. For example for n=4, 625 Mhz is required for an operational data rate of 2.5 Gbps. A single clock phase is buffered and brought out of the PLL 12 and is intended to drive into the Phase Buffer circuit 14.

The PLL 12 illustrated contains a multi-stage, voltage controlled ring oscillator (VCO) 18, a frequency divider 20, phase-frequency detector 22, charge pump 24 and multipole "ripple capacitor" loop filter 26. These elements form a "fine" control loop 27. Although, in the embodiment of the invention described herein, the VCO 18 is a four-stage oscillator and the frequency divider 20 is a four-times divider, other stage and divider multiples will be apparent to one skilled in the art, and the invention is not limited to the specific four-stage oscillator and four-times divider elements described. The fine control loop 27 is a conventional analog loop and is intended to provide a stable low-noise low-jitter clock source for the transmitter circuit 10. The range, gain and bandwidth of the loop 27 is designed to compensate for relatively high frequency but small perturbations due to power supply changes and the coarse loop.

Figure 2:
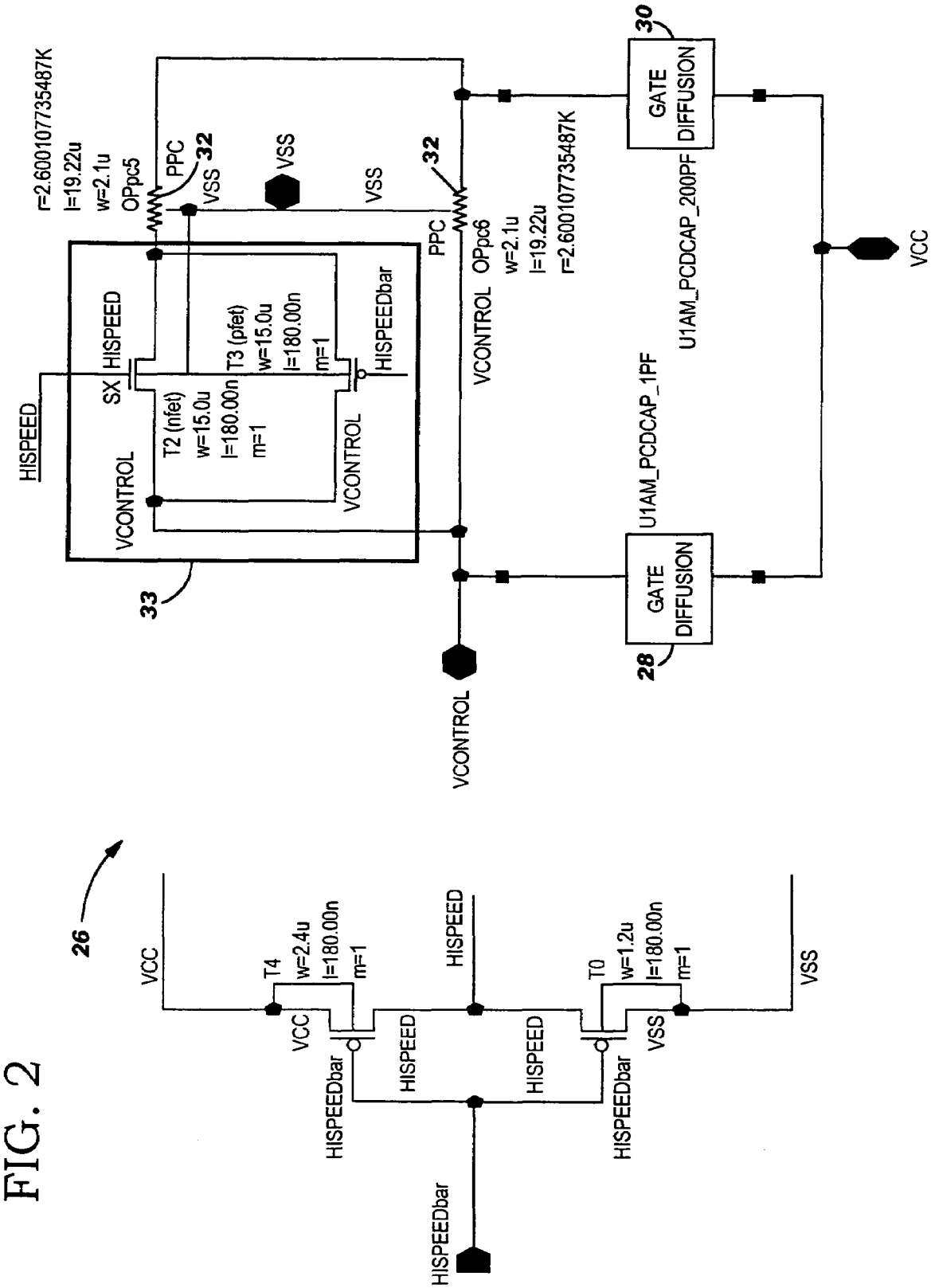
FIG. 2 is a schematic diagram of a loop filter according to the present invention.

Referring now to FIG. 2, a schematic of one embodiment of the loop filter 26 is provided. The loop filter circuit 26 illustrated is a second order CRC low pass filter. A small "ripple" capacitor 28 is used to attenuate charge pump ripple, and a larger "loop filter" capacitor 30 is used to stabilize the circuit and set the dominant pole. The loop filter circuit 26 converts the charge pump current received from the charge pump 24 into a control voltage that drives the VCO circuit 18. Resistors 32 add a zero into the circuit to null out the affect of the pole at the origin (caused by the VCO 18). The loop filter circuit 26 also sets the dominant pole of the circuit. The ripple capacitor 28 is much smaller than the loop filter capacitor 30. This keeps its pole much further out in the frequency. The resistors 32 also factor into the open loop gain which comes into play for the stability of the system and the settling time (or response time of the circuit). Although, in the embodiment illustrated, the VCO circuit 18 gain ranges from 300 MHz to 3.8 GHz depending upon process and temperature, other gain values may be achieved, as will be readily apparent to one skilled in the art.

Accordingly, the resistors 32 are switchable. A switch 33 is controlled by logic based on the operation of the PLL circuit 12, said logic preferably setting a range between 2.5 GHz and 3.125 GHz in the current embodiment. Other embodiments of the invention (not shown) may have a value range greater or smaller, or covering a different value range; the range described is for illustrative purposes only and in no way limits the application and practice of the invention. The VCO 18 has both a "fine" and "coarse" control voltage in order to minimize the required gain of the fine loop 27.

Figure 3:
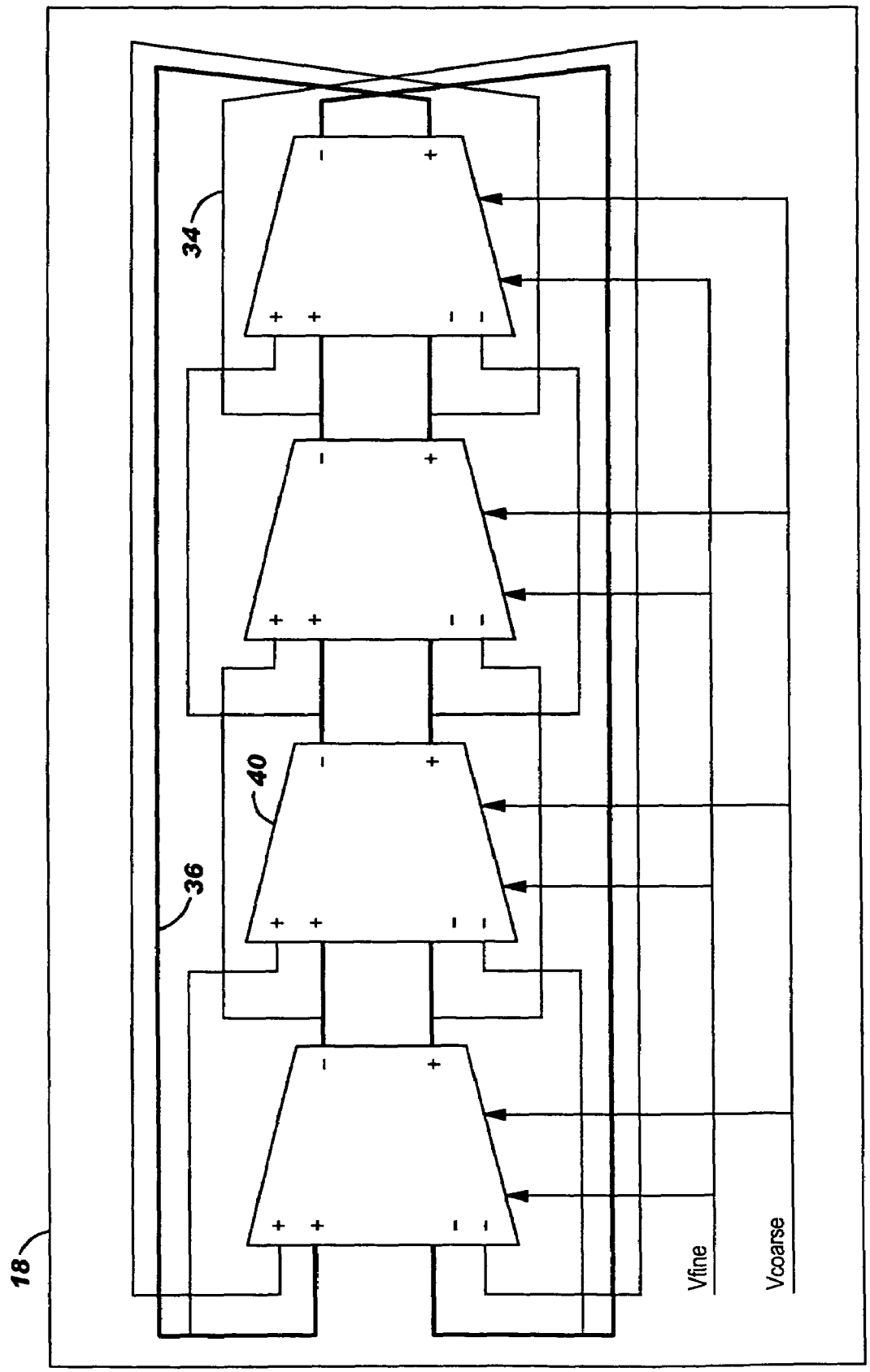
FIG. 3 is a schematic of a transmit VCO according to the present invention.

Referring now to FIG. 3, a schematic of a four-stage delay cell embodiment of the transmitter VCO 18 is provided. The VCO 18 itself is of a form which adjusts the speed of oscillation by adjusting local feedback within a plurality of delay cells 40, as well as controlling feedback within the VCO 18, which provides pre-charge of the delay cells 40 for speed enhancement. It is preferred that the VCO operate at 2.125 GHz to 3.125 GHz across a defined range of operating conditions and produce a differential clock output. Other embodiments of the invention (not shown) may have a value range greater or smaller, or covering a different value range; the range described is for illustrative purposes only and in no way limits the application and practice of the invention.

In a conventional ring oscillator, the oscillation frequency is determined as $1/(2N\tau)$, where N is the number of stages and $\tau$ is the unit delay time of a delay cell. Hence, the frequency of oscillation is decided by the delay time of one delay element. Higher operation frequency and wider tuning range are achieved in the embodiment of the invention illustrated in FIG. 3 by implementing a dual delay scheme. Dual-delay means that both negative skewed delay paths 34 and normal delay paths 36 exist in the same oscillator. (In FIG. 3 the negative skewed delay paths 34 are represented by normal lines, and the normal delay paths 36 as thicker boldface lines.) The negative skewed delay paths 34 decrease the unit delay time below that of a single inverter delay time. As a result, a higher operating frequency can be obtained. Since the normal delay paths 36 also exist, the frequency range of the VCO 18 can be wider than that of an oscillator with only skewed delay paths.

Figure 4:
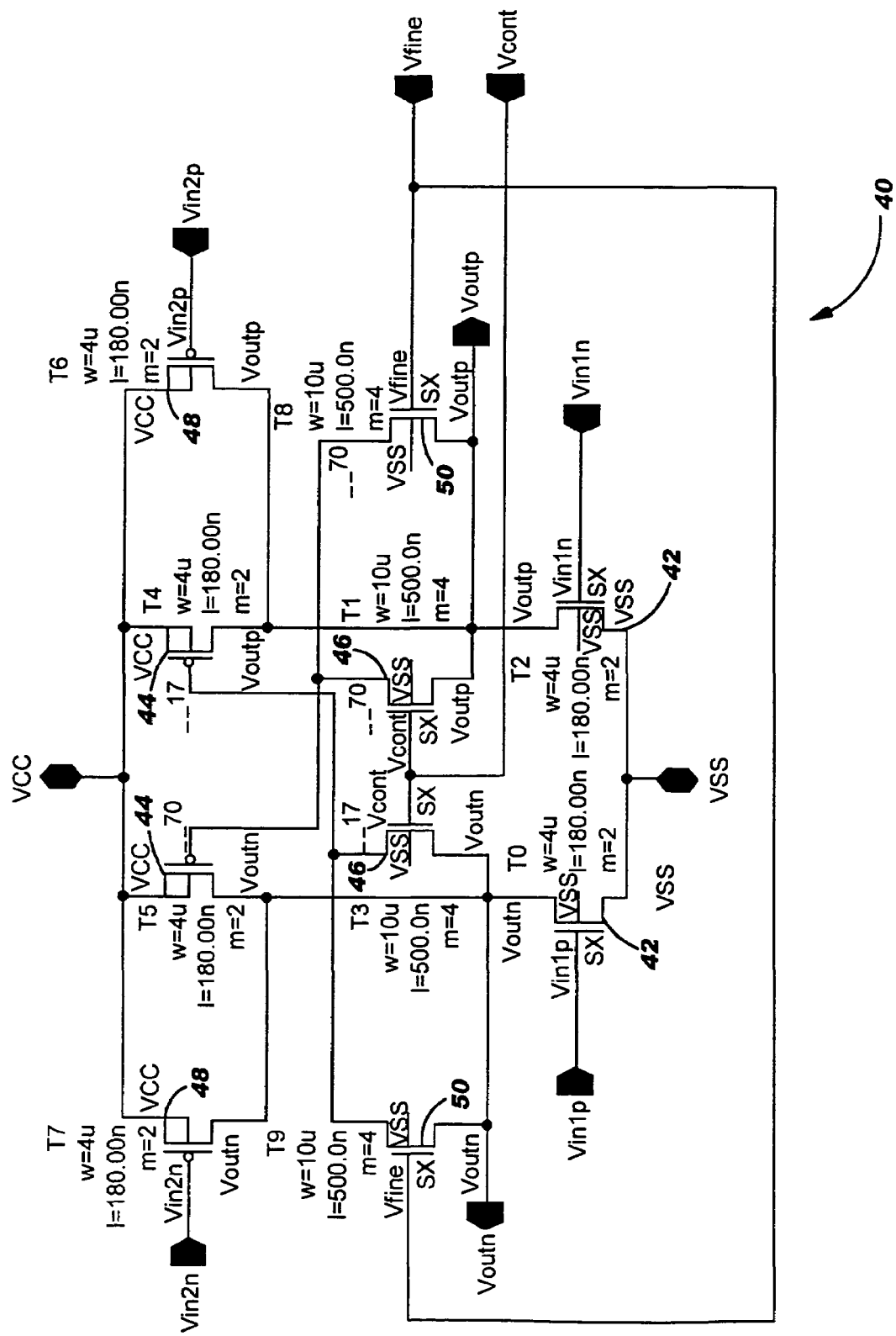
FIG. 4 is a schematic of a transmit VCO delay cell according to the present invention.

Referring now to FIG. 4, a schematic of a VCO 18 transmit delay cell 40 according to the present invention is provided. It is preferred that the delay cell 40 be tunable from 80 ps to 125 ps delay over the VCO 18 operating range. Other embodiments of the invention (not shown) may have a value range greater or smaller, or covering a different value range; the range described is for illustrative purposes only and in no way limits the application and practice of the invention. It is also preferred that the delay cell 40 produce full swing differential outputs. At the core of the delay cell 40 is an NMOS differential pair (T0,T2) 42 with a PMOS pair latch (T4,T5) 44 as an active load. Cross-coupled NMOS transistors (T1,T3) 46 control the maximum gate voltage of a pair of PMOS load transistors 48 and limit the strength of the PMOS latch 44. When the control voltage is low, the strength of the latch 44 becomes weak, and the output driving current of the PMOS latch 44 load increases. Therefore, the state of the latch 44 is changed easily and the delay time is reduced. Thus, when the control voltage is high, the latch 44 becomes strong, and it resists the voltage switching in the differential delay cell 40. As a result, the delay time increases. With the help of the positive feedback of the latch 44, the transition edges of the output waveform remain sharp in spite of slow delay time. Since the delay cell 40 is basically a simple differential inverter, a full-swing waveform is generated.

To utilize both negative skewed and normal delay paths, the pair of PMOS transistors (T6, T7) 48 are added to the PMOS loads of the delay cell 40 and are used to take the negative skewed signals. The negative skewed signal is connected to the PMOS input of the delay cell 40 and the normal signal is connected to the NMOS input of the delay cell. The negative skewed signal is taken from the two stages before the current delay stage. The signal prematurely turns on the PMOS during the output transition and compensates for the performance of the PMOS, which is usually slower than that of the NMOS.

A second pair of NMOS transistors (T8,T9) 50 is inserted in shunt with the original NMOS cross coupled pair 46. These devices are smaller and longer and, therefore, have less effect on performance. This allows for a "fine" control of the delay cell.

Referring again to FIG. 1, in addition to the fine control loop 27 elements, the PLL 12 contains a reference generator 60, a voltage comparator 62, PLL control logic 64, a Digital to Analog Converter (DAC) 66 and a low-pass filter 68. These elements form the digital "coarse" control loop. This digital coarse loop is used to compensate for process and temperature to put the VCO 18 in the correct operating range. Although the embodiment of the PLL 12 described thus far is a dual loop PLL having both "fine" and "coarse" loops, alternative embodiments may utilize only one loop, and a dual loop PLL structure is not required to practice the invention. The analog fine loop 27 is then able to lock to the reference clock and produce a preferred stable 2.125 GHz/3.125 GHz clock. Other embodiments of the invention (not shown) may have different clock values, and the values described are for illustrative purposes only and in no way limit the application and practice of the invention. It is preferred that the reference level for the comparator 62 is produced by a cbias circuit 11.

The coarse control loop is a digital representation of a conventional analog control loop based on a "leaky" loop filter capacitor. That type of loop relies on leakage from the loop filter circuit 26 to drive the control voltage in a particular direction regardless of the frequency of the VCO 18. This leakage is compensated by the phase detector 22 and charge pump 24, which only increase the charge on the loop filter circuit 26. The loop is stable when the charge added to the loop filter circuit 26 balances the charge that is leaking.

The PLL control logic 64 in the coarse control loop has an up/down counter (not shown) whose value represents the charge on the loop filter circuit 26. This counter is slowly decremented to represent leakage. The voltage comparator 62 is high or low depending on whether the fine control voltage is operating in the upper or lower half of its range. To balance the leakage, the control logic 64 samples the comparator 62 output. After multiple samples showing upper range operation, the up/down counter (not shown) is incremented to represent adding charge to the loop filter circuit 26. The up/down counter (not shown) output is converted to a control voltage by the DAC 66 and low-pass filter 68. The coarse control loop is intended to compensate for manufacturing process and relatively low frequency but large changes due to power supply and temperature drift. It is discussed more thoroughly in the co-pending application previously incorporated, Ser. No. 09/996,113, filed Nov. 28, 2001, for "Unified Digital Architecture."

Figure 12:
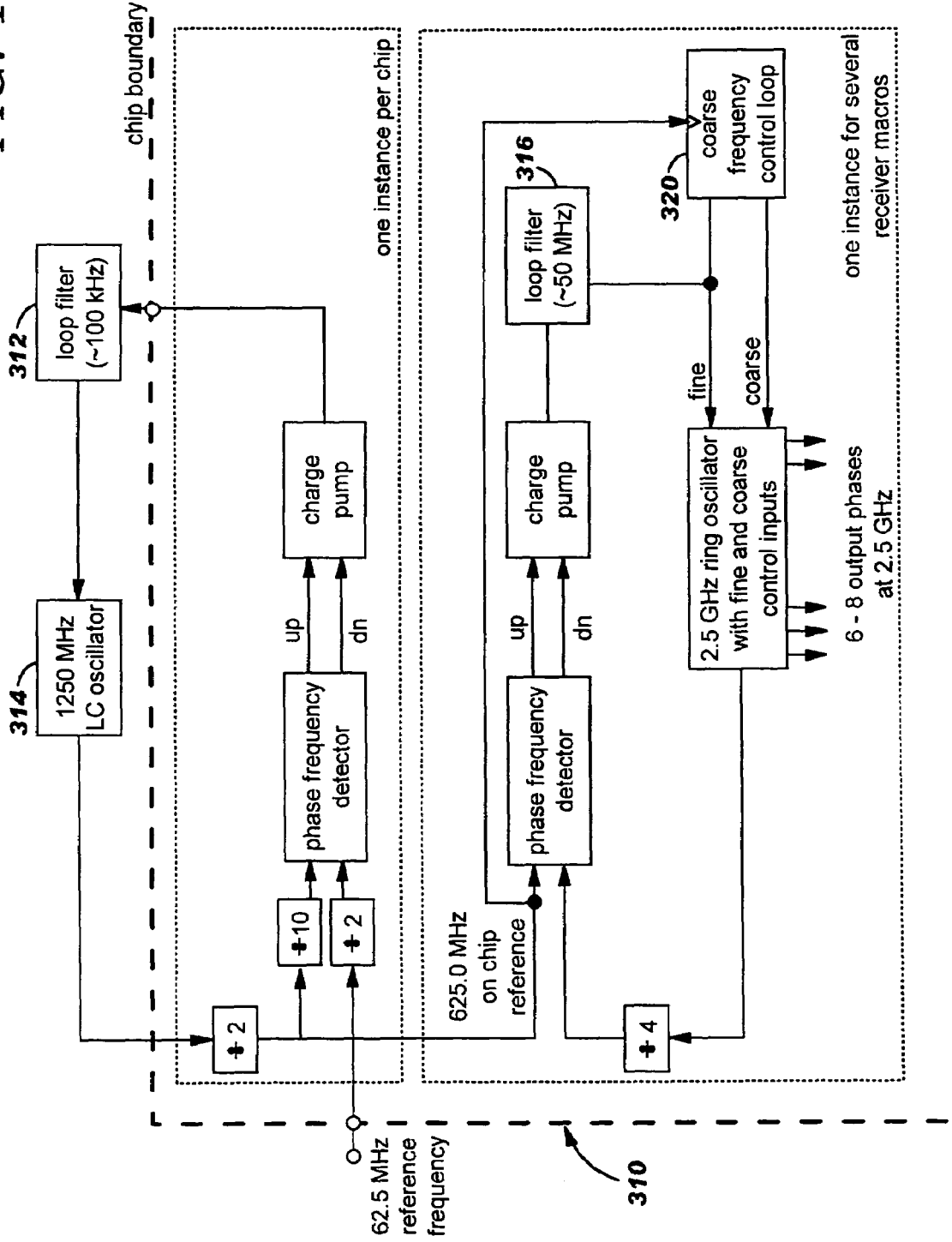
FIG. 12 is block diagram of another embodiment of a dual loop PLL according to the present invention.

FIG. 12 is block diagram of another embodiment of a dual loop PLL according to the present invention. From PLL theory, it is known that for good phase noise/jitter performance, the tuning sensitivity and the multiplication factor should be small. As a potential solution to these problems, a two-stage reference frequency multiplication is suggested with an external loop filter 312 and LC oscillator 314 in the first stage and a dual loop on-chip PLL 310 in the second stage. The first loop filter 316 has a narrow bandwidth, eventually allowing to meet jitter transfer requirements. The phase noise/jitter performance should be dominated by the quality of the external VCO and may by specified or selected by the customer. The second PLL loop filter (not shown) is as large as possible to suppress any ring oscillator noise. This is intended to allow a tracking of the performance of the 625 MHz signal from the first loop, dominating the overall jitter performance.

Figure 13:
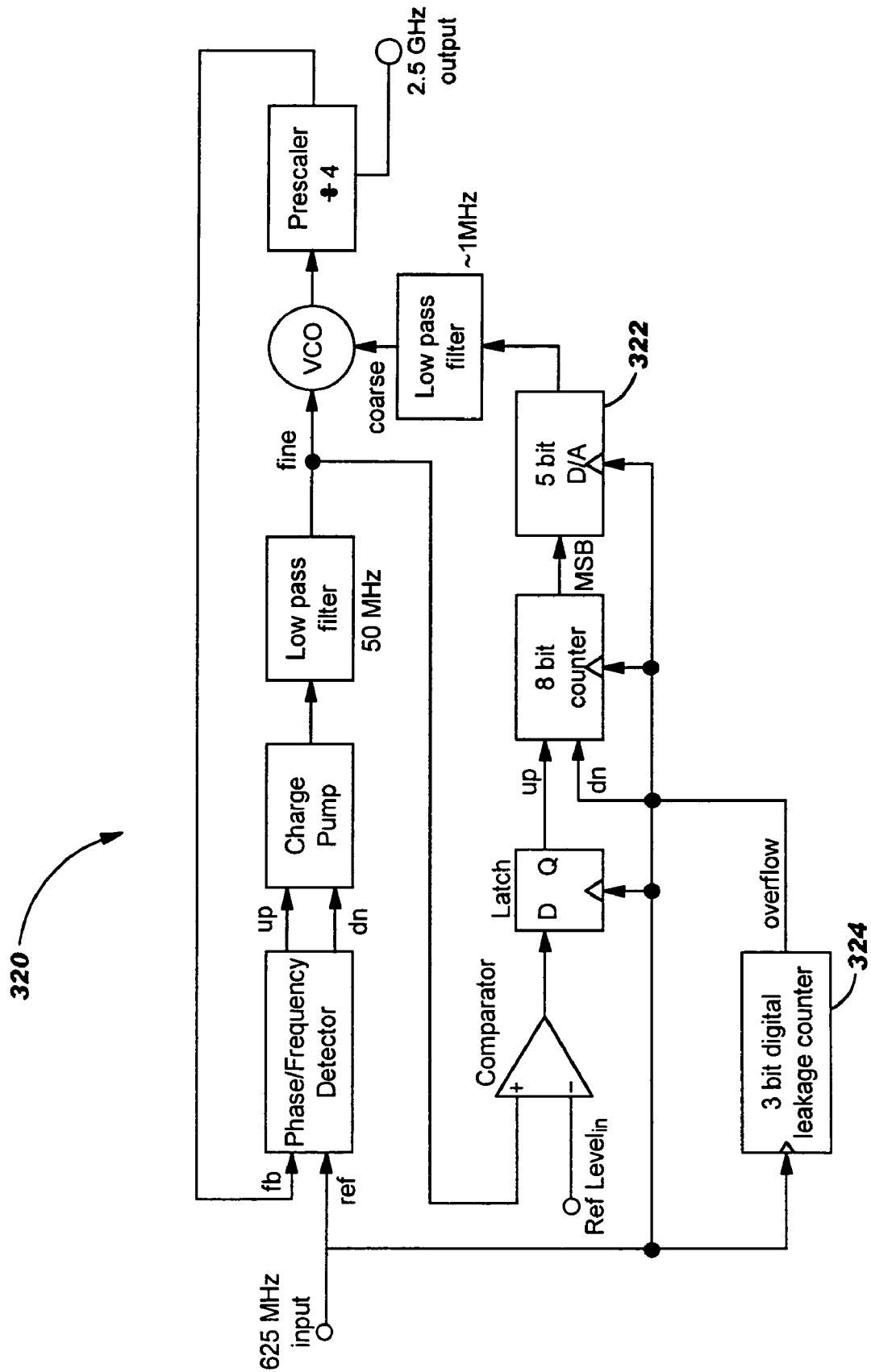
FIG. 13 is a block diagram of the coarse loop of FIG. 12.
Figure 14A:
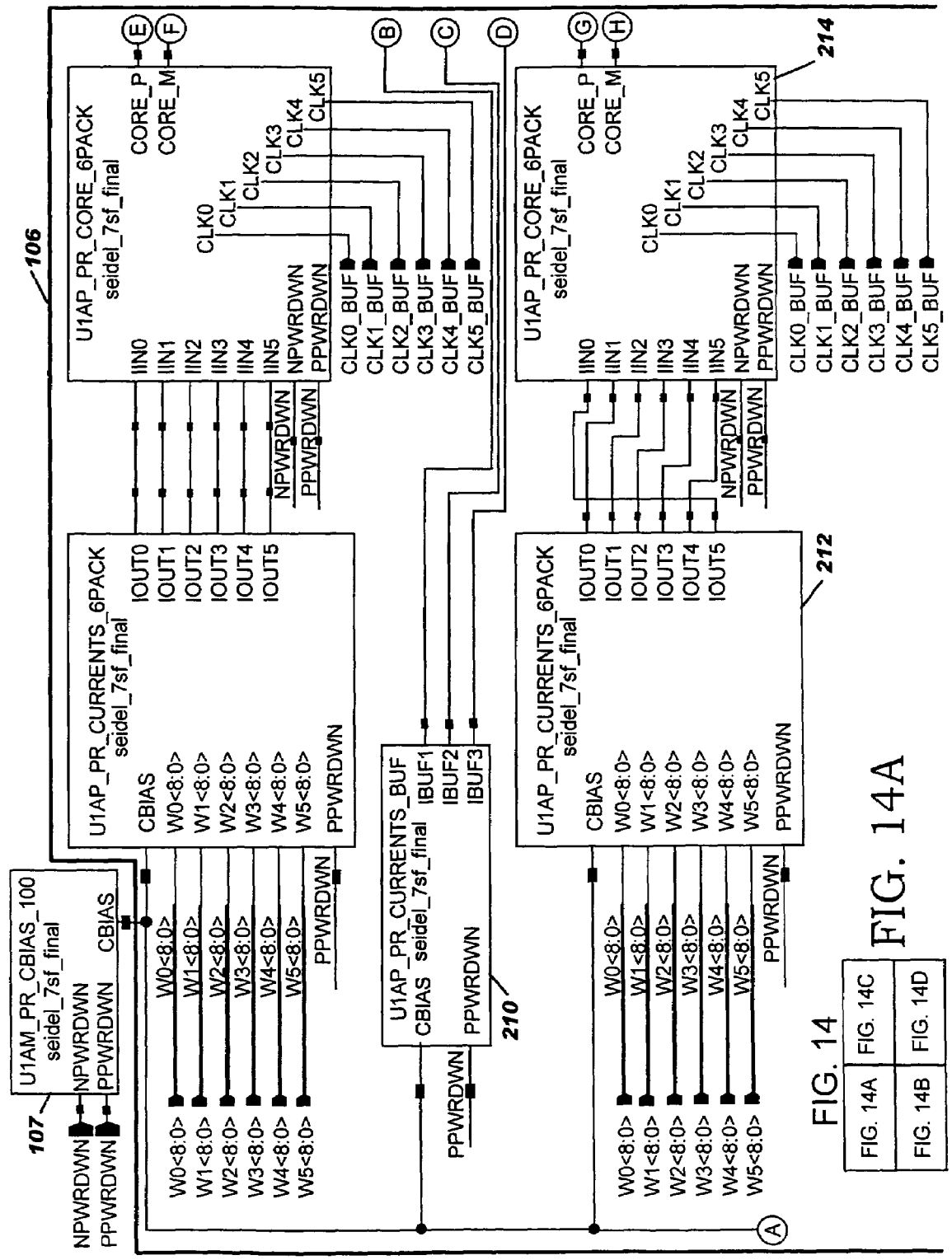
FIGS. 14A–D, thereafter
Figure 14B:
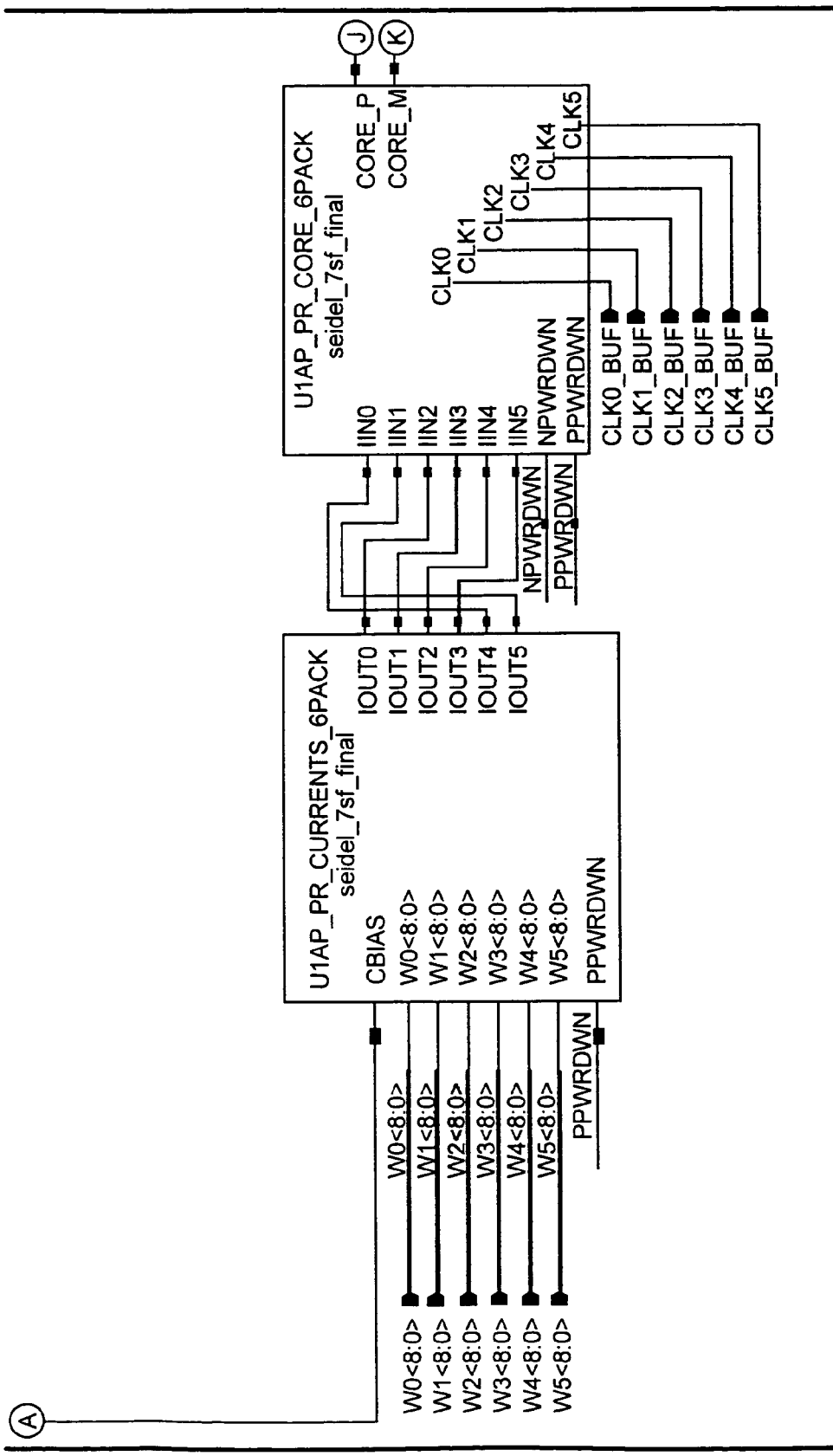
Figure 14C:
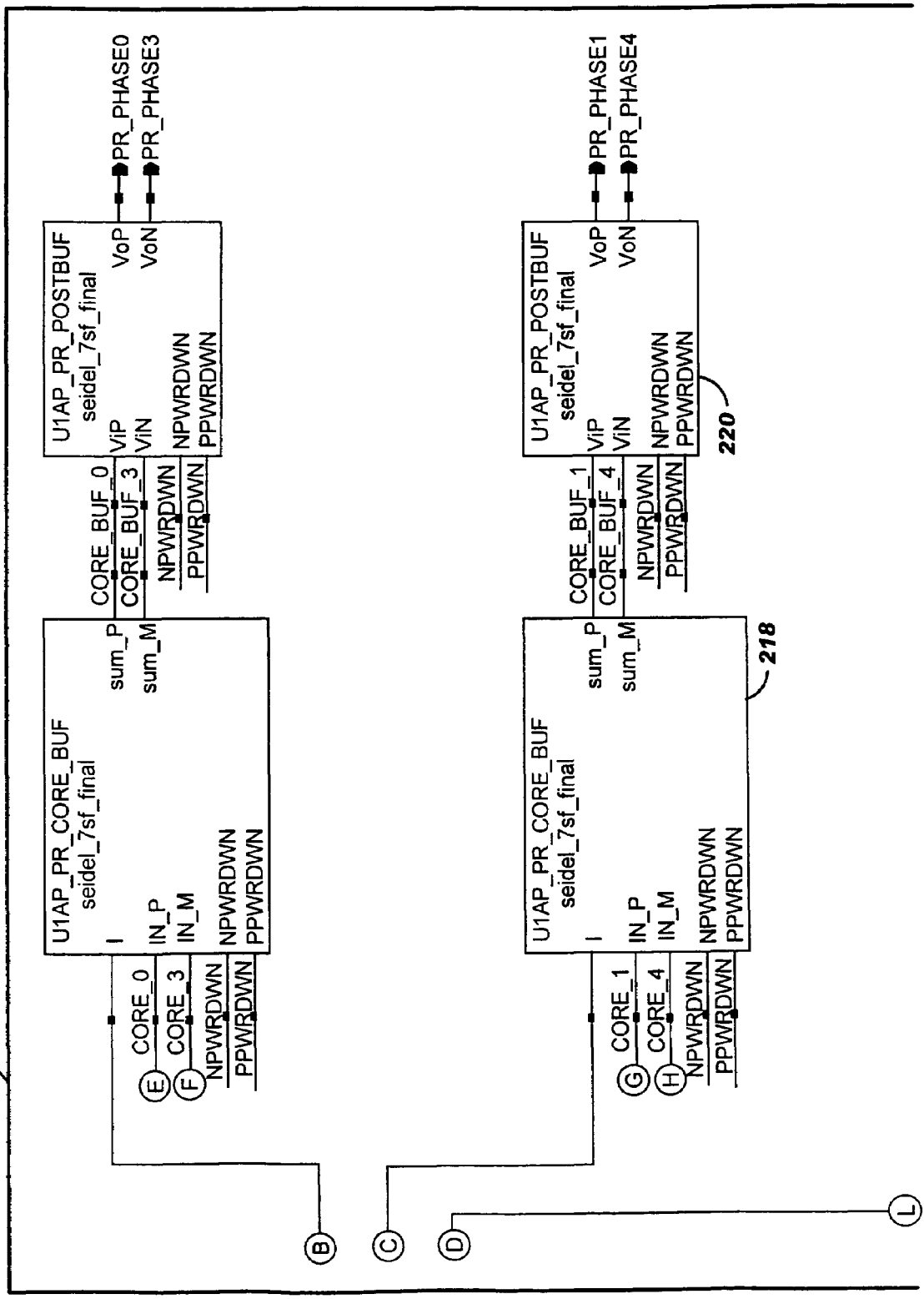
Figure 14D:
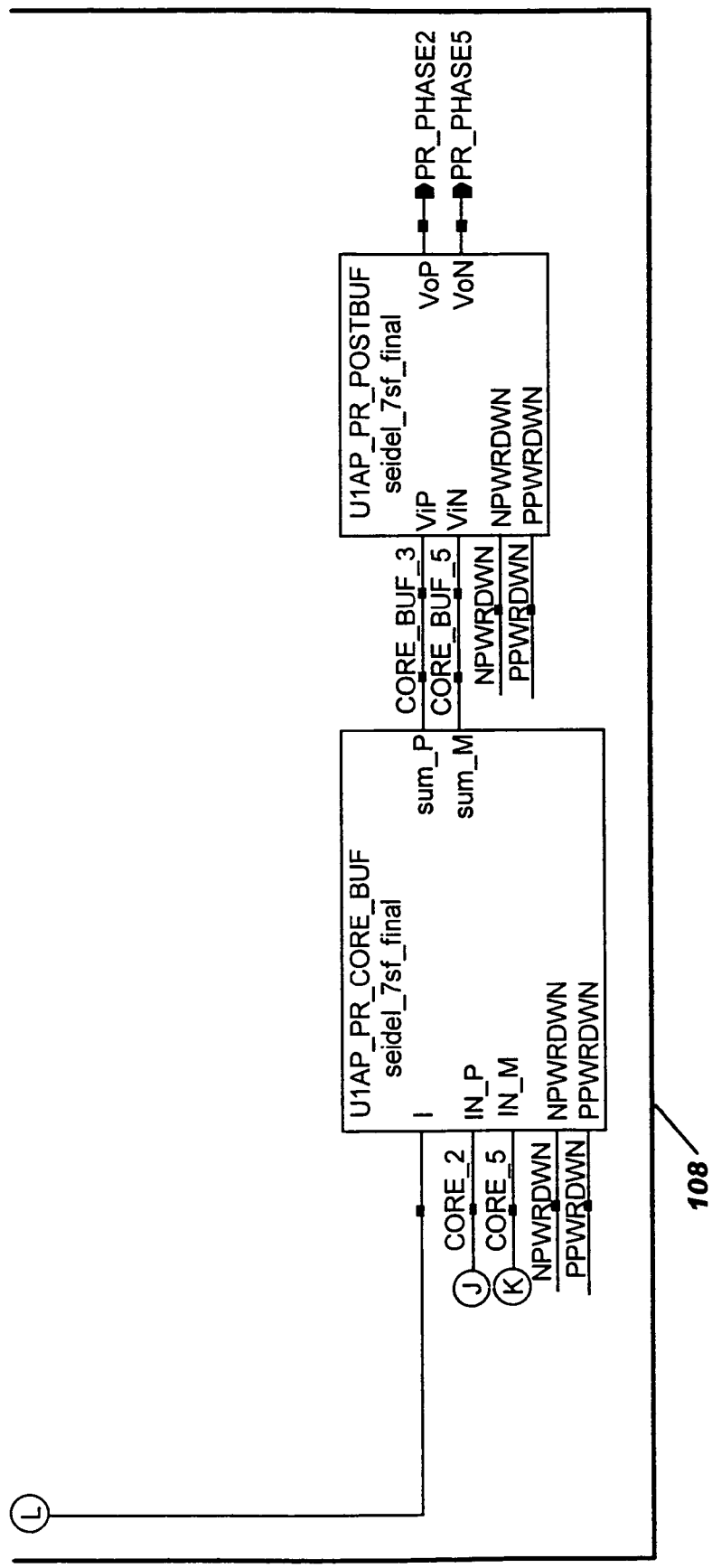

FIG. 13 is a block diagram of the coarse frequency control loop 320 of FIG. 12. The basic idea is to introduce a controlled amount of digital leakage into one frequency direction. The voltage of the fine tune input is sampled and, if a predefined level is crossed, the coarse voltage is digitally adjusted with a D/A converter 322. With this approach, the loop gain in one direction is essentially zero. This breaks the loop and guarantees stability. A digital integrator (counter) 324 realizes a low pass function for improved switching noise.

Referring again to FIG. 1, a Phase Buffer circuit 14 according to the present invention comprises phase pre-drive circuits 70, phase buffer/delay circuits 72 and a transmit phase buffer latch 74. The phase buffers 72 drive out to the latch 74 and thereby provides the clock necessary for the full rate design of the present embodiment. The phase buffers 72 must also provide adequate rise and fall times taking into account the estimated net loading.

The phase buffers 72 may comprise any circuits that drive clocks from sources to circuits that have high capacitive loading due to wiring and/or gate loading. At the clock rates used in the present invention, phase buffers 72 are important in assuring reasonable rise and fall times, duty cycle, and jitter performance of system clocks. The phase buffers 72 are described in more detail later in this specification in the description of the receiver PLL circuitry.

One embodiment of an equalization driver circuit 16 is illustrated in FIG. 1. The equalization driver circuit 16 is a Finite Impulse Response (FIR) equalization driver comprising current-mode differential drive circuits that are controlled by a FIR-type filter function. It is preferred to equalize the transmitter data stream as a means of minimizing the amount of inter-symbol interference created by copper skin effect and circuit card dissipation factor; the former related to the root of the operating frequency, the latter related in a linear manner to the operating frequency. The transmitter FIR circuit 16 is described in detail in the related U.S. patent application entitled "Programmable Driver/Equalizer with Alterable Analog Finite Impulse Response (FIR) Filter Having Low Intersymbol Interference & Constant Peak Amplitude Independent of Coefficient Settings", Ser. No. 09/749,908, filed Dec. 29, 2000, previously incorporated. Other types of equalization driver circuits may be used with the present invention, and the driver circuit described is for illustrative purposes only and in no way limits the application and practice of the invention.

Figure 5:
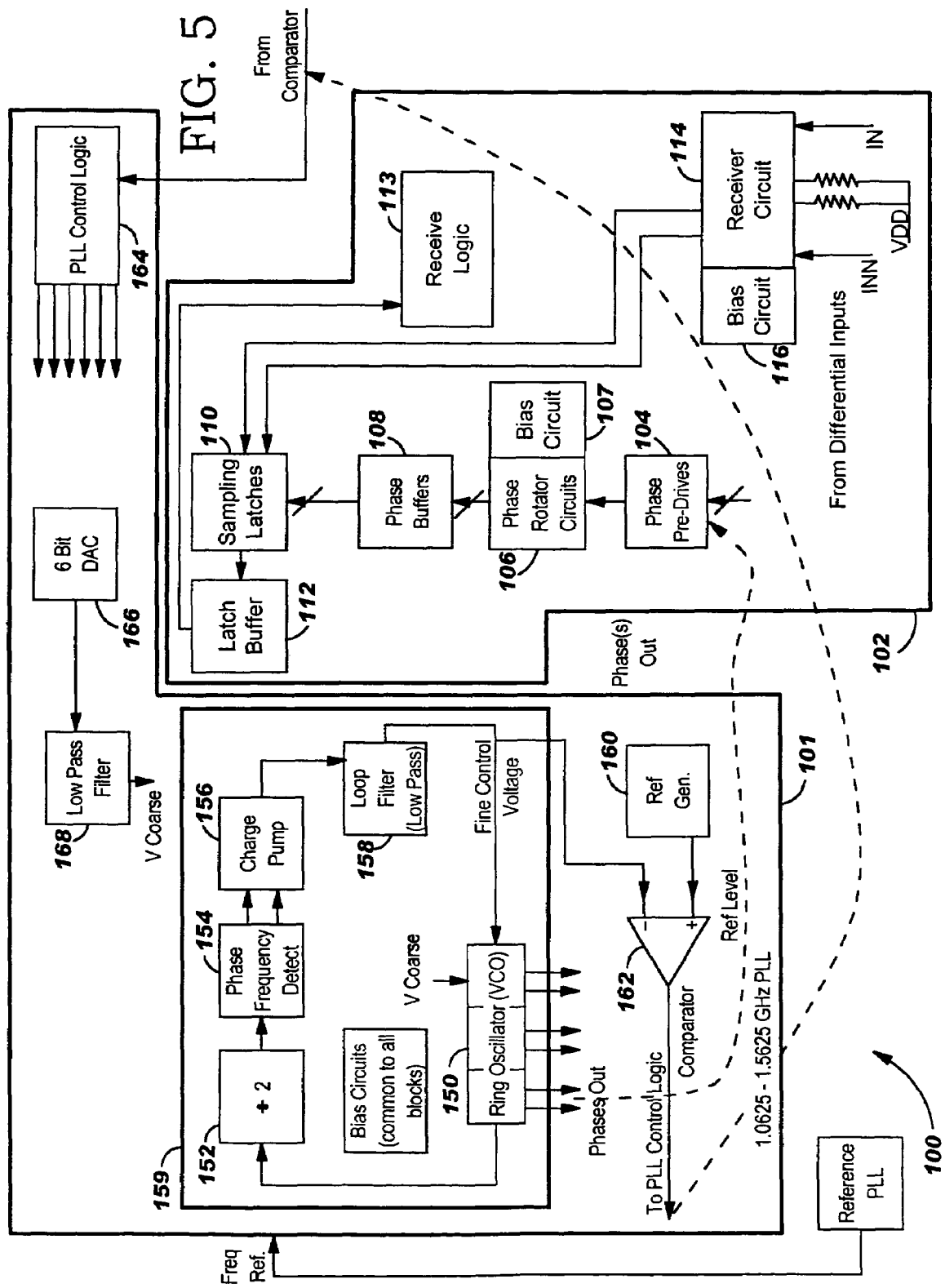
FIG. 5 is a block diagram of the receiver architecture of the present invention.

Referring now to FIG. 5, a block diagram of the receiver analog architecture 100 of the present invention is shown, comprising a half-data rate PLL circuit 101 and an analog receiver circuit block 102. The analog receiver circuit block 102 comprises a Phase Pre-Drive 104, Phase Rotator Circuits 106 and associated phase rotator bias circuits 107, a Phase Buffer circuit 108 to repower the PLL signals, six sampling latches 110, and latch buffer 112 driving receiver logic 113. Providing six latches allows the circuit to have three samples per bit of data for a half-data rate. The sampling latches 110 are also interfaced with a receiver circuit 114 that is a differential type containing fixed input bias 116 (for power savings) which translates the input signal to that compatible with a high speed differential latch. The output circuits are powered-up to support the necessary loading from the latches and wiring.

Figure 6:
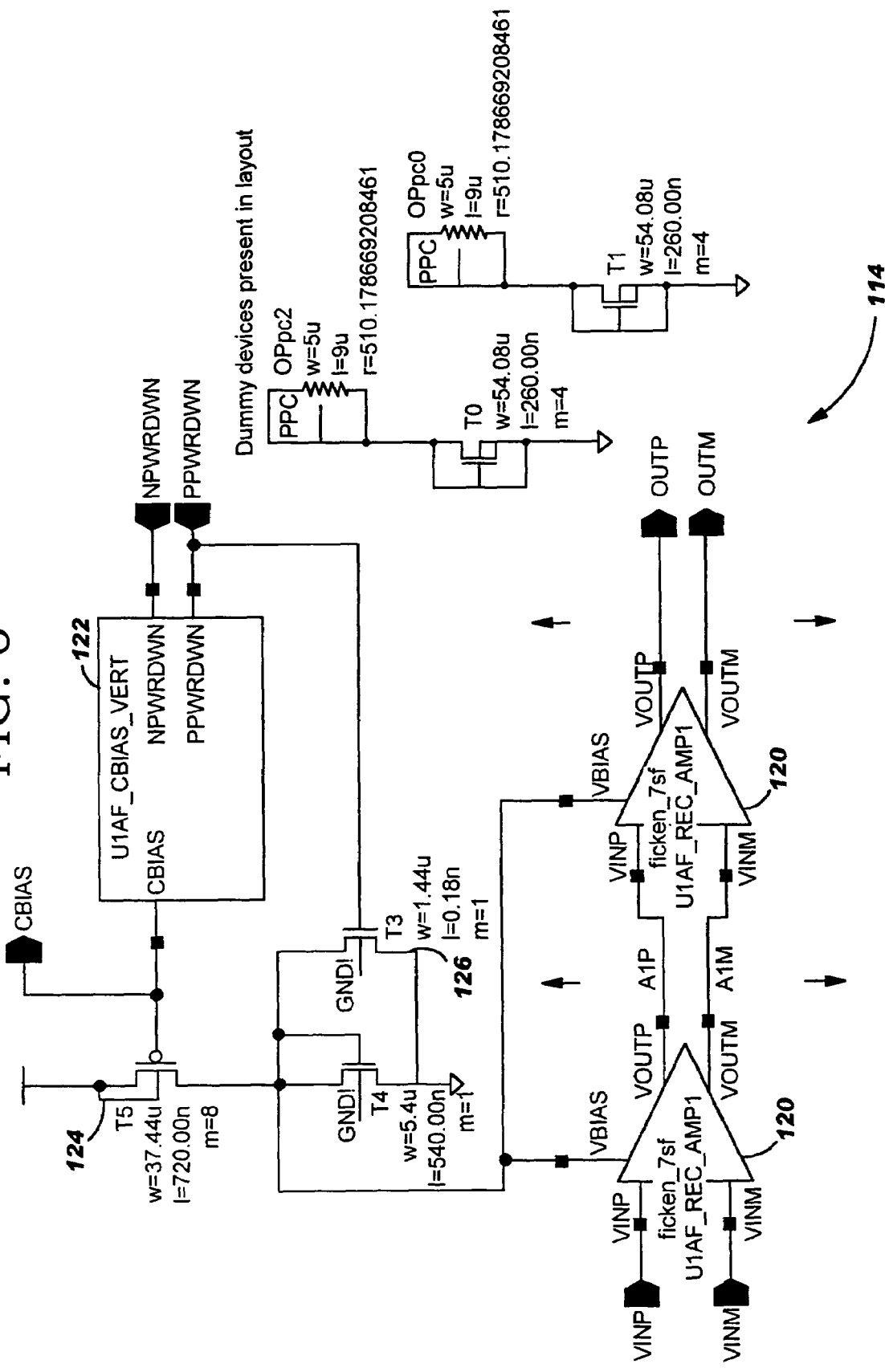
FIG. 6 is a schematic view of a receiver circuit according to the present invention.

An embodiment of the receiver circuit 114 according to the present invention is illustrated in FIG. 6. It is designed to supply a required differential output voltage to six sample latches from an input differential voltage bitstream operating at 2.5 Gb/s. The preferred requirements for the receiver circuit 114 are noted in Table 7 below. The measured results were taken at the operating condition that yielded the worst performance with 150 mVP-P additional noise on VDD. All results are on a per-link basis for the fully extracted receiver. It is to be understood that other embodiments of the invention (not shown) may have different requirements, and the values described are for illustrative purposes only and in no way limit the application and practice of the invention.

TABLE 7

Receiver Circuit Specifications

| Specification | Requirement | Measured | Operating Cond. |
|---|---|---|---|
| Maximum Current | 6 mA | 6.6 mA | 1.96 V, 25° C., ASICBC |
| Jitter from Power Supply Noise and Process Limitations | 13 ps | 24.6 ps | 1.62 V, 125° C., ASICWC |
| Minimum Differential P—P Input | 100 mV | 100 mV | 1.62 V, 125° C., ASICWC |
| Minimum Differential P—P Output | 800 mV | 858 mV | 1.62 V, 125° C., ASICWC |
| Output Common Mode | 0.9 V–1.3 V | 0.95 V–1.2 V | all conditions |
| Bandwidth | not specified | 918 MHz | 1.62 V, 125° C., ASICWC |
| DC Gain | not specified | 10.5 | 1.62 V, 125° C., ASICWC |
| Input Common Mode Range | not specified | 0.6 V–1.6 V | 1.62 V, 125° C., ASICWC |

Receiver circuit 114 is comprised of a bias network and two differential amplifiers 120. A CBIAS cell 122 provides a DC reference voltage for a PMOS transistor 124 that is then converted to a reference voltage for an NMOS transistor 126. Two stages of amplification were chosen to try to maximize gain and bandwidth; however, the invention is not limited to two stages.

Figure 7:
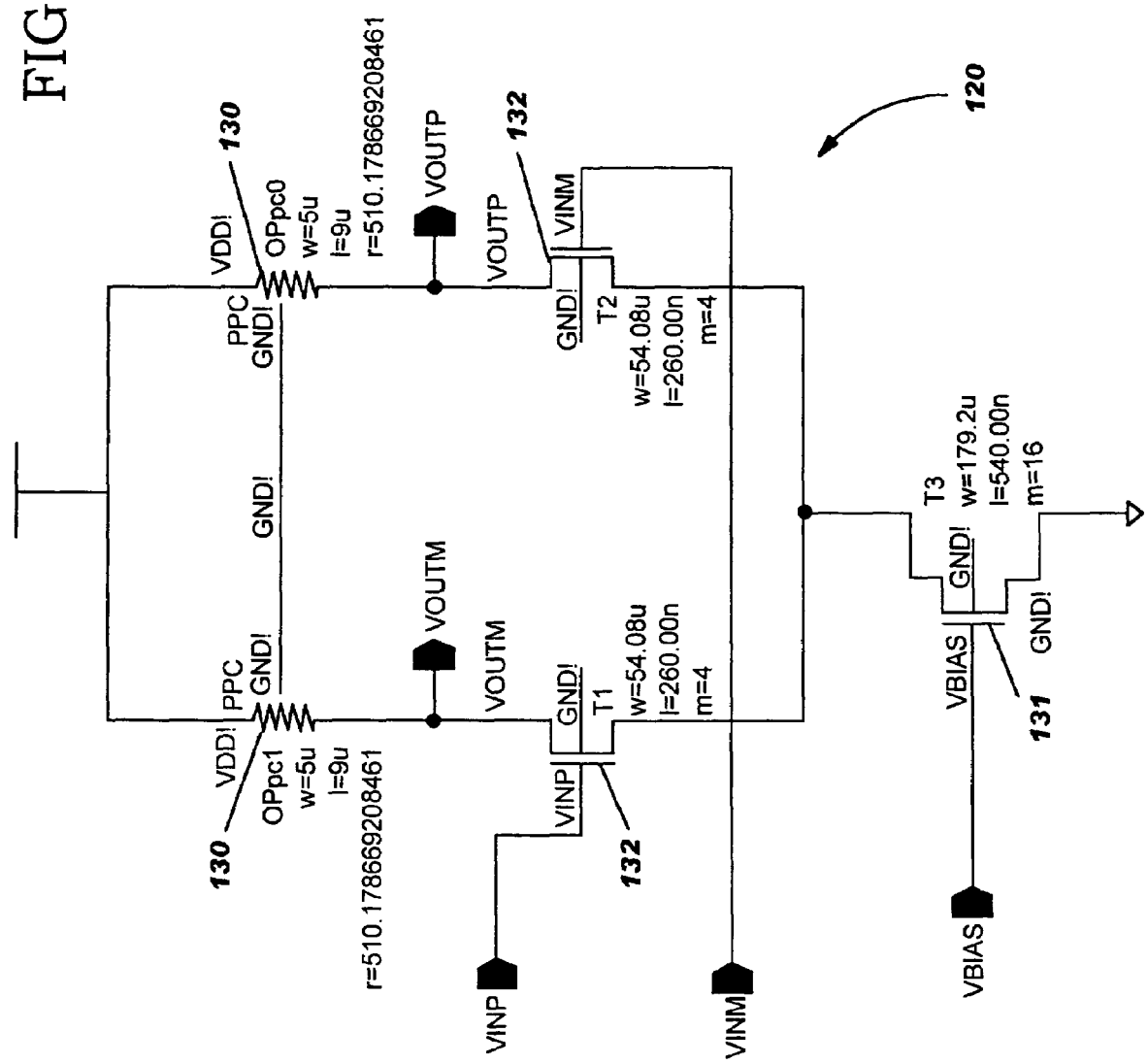
FIG. 7 is a schematic view of a differential amplifier according to the present invention.

FIG. 7 is a schematic view of the differential amplifier 120. It is a traditional design with an NMOS tail current and resistive loading to give the necessary bandwidth. The NMOS tail 131 mirrors off the 100 µA CBIAS current to provide approximately 3 mA to the diff-pair 132. This 3 mA is based on the maximum allowable current for the receiver. The size of the resistors 130 was chosen to provide the necessary output common mode voltage based on the 1.5 mA pulled through each. The input transistors 132 were then sized to achieve a gain of approximately 20 dB.

Figure 8:
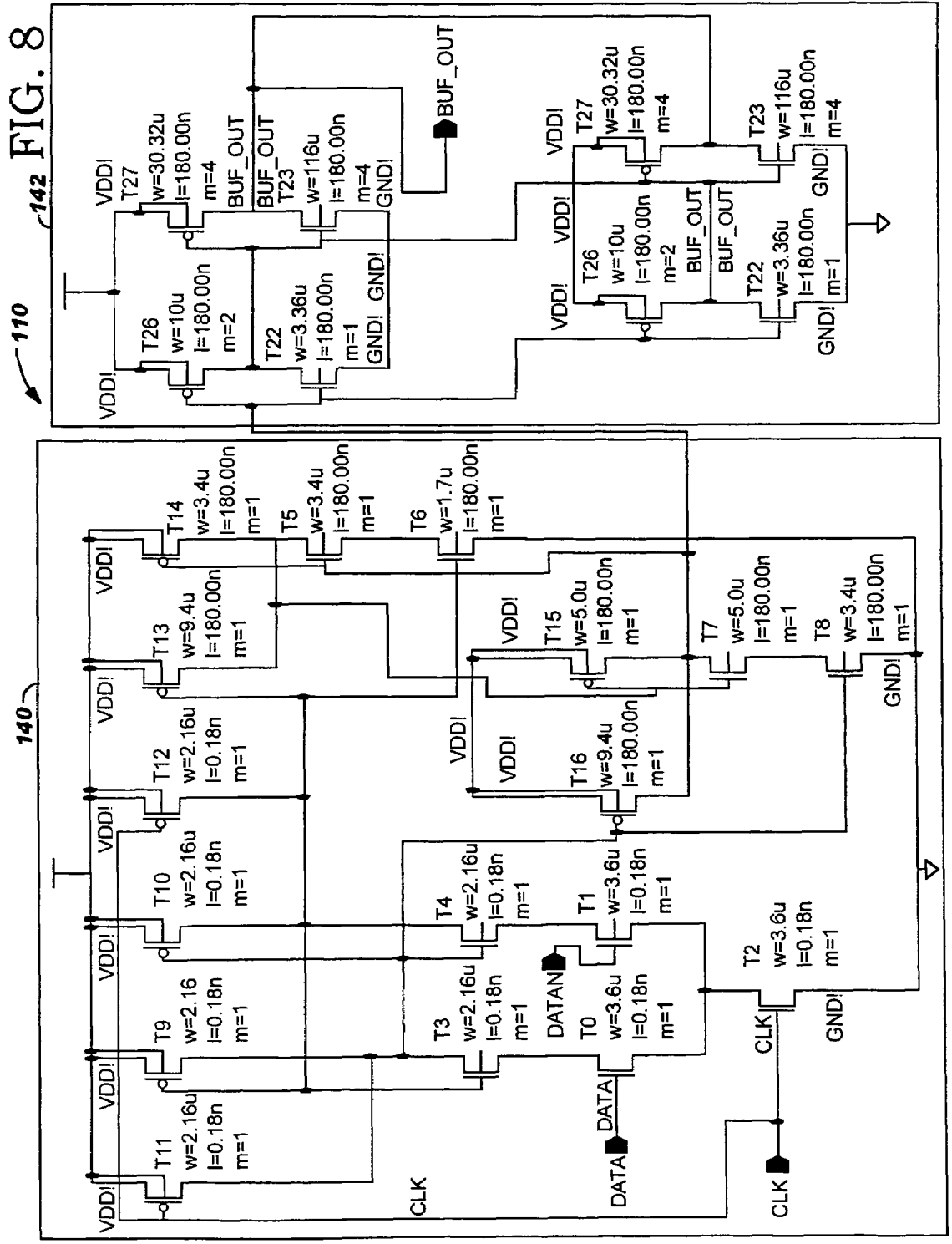
FIG. 8 is a schematic diagram of a receive sampling latch according to the present invention.

FIG. 8 is a schematic diagram of an exemplary sampling latch 110 referred to by FIG. 5. The sample latches 110 are fed data by the input receiver circuit 114 and obtain clocks from the combination of the PLL circuit 101, phase rotator circuit 106 and phase buffer complex 108. The data input to the sample latches 110 is differential in nature and, as such, the sample latches 110 are pseudo analog circuits. It is important that the design of the input receiver and the sample latches be very closely coordinated to minimize the effects of noise on the jitter associated with these two circuits.

The latch 110 illustrated in FIG. 8 is a CMOS, positive edge triggered latch circuit. It takes differential data inputs and single ended clock and outputs a single ended, logic level signal. The complex consists of two circuits, the latch 140 itself and a buffer 142 that sharpens the output of the latch 140. The latch 140 receives its differential data from the receiver circuits 114 and performs differential or single ended conversion to it and drives the output to the receive logic 113.

With CLK-Q delay <300 p (nominal) and a sample and hold window <35 p as performance boundaries, an embodiment of the latch circuit 110 illustrated in FIG. 8 was simulated over various process, temperature and supply conditions with varying loads. The appropriate parameters were measured to ensure adequate performance over these conditions. Also, simulations were performed to determine the setup and hold window, the meta-stability window, and the jitter performance of the latch 110. The following Table 8 demonstrates various performance parameters of the latch circuit 110.

TABLE 8

Latch Operating Parameters

| Operating Conditions | CLK-Q delay ps | tr ps | tf ps |
|---|---|---|---|
| TT, T = 50, VDD = 1.8, Load = 30 fF, Nominal CLK | 187 | 37 | 34 |
| ASICWC, T = 125 C., VDD = 1.62, Load = 40 fF, Slow CLK | 297 | 56 | 52 |
| ASICBC, T = 25 C., VDD = 1.98, Load = 20 fF, Fast CLK | 128 | 29 | 26 |

The sampling latch circuit 110 has a negative setup and hold window. It was measured with respect to the output of the latches 110 (and not with respect to the output of the latch buffer 112). Any CLK-data delay that result in more than 300 ps CLK-Q delay was also included in this window calculation. The preferred sample and hold window for this latch is 10 ps.

Referring again to FIG. 5, the receiver PLL circuit 101 is the clock source for oversampling the receive data and runs at half the data rate. A frequency reference is required which is 1/nth target data rate; for example, for n=2, 625 Mhz is required for an operational data rate of 1.25 Gbps. Six clock phases are buffered and brought out of the PLL and are intended to drive into the Phase Rotator circuit 106.

The receive PLL 101 of FIG. 5 has a six-stage voltage controlled ring oscillator (VCO) 150, a 2× frequency divider 152, phase-frequency detector 154, charge pump 156 and multi-pole loop filter 158. These elements form the "fine" control loop. The receive VCO 150 has both a "fine" and "coarse" control voltage in order to minimize the required gain of the fine loop. In addition to the fine control loop elements, the receive PLL 101 contains a reference generator 160, a voltage comparator 162, PLL control logic 164, a Digital to Analog Converter (DAC) 166 and a low-pass filter 168. These elements form the "coarse" control loop.

The fine control loop 159 is a conventional analog loop and is intended to provide a stable low-noise low-jitter clock source for the receiver. The range, gain and bandwidth of the loop is designed to compensate for relatively high frequency but small perturbations due to power supply changes and the coarse loop.

The coarse control loop is a digital representation of a conventional analog control loop based on a "leaky" loop filter capacitor. That type of loop relies on leakage from the "loop filter cap" to drive the control voltage in a particular direction regardless of the frequency of the receive VCO 150. This leakage is compensated by the phase detector 154 and charge pump 156 that only increase the charge on the "cap." The loop is stable when the charge being added to the cap balances the charge that is leaking.

The receive PLL control logic 164 in the coarse control loop has an up/down counter (not shown) whose value represents the charge on a loop filter cap. This counter is slowly decremented to represent leakage. The voltage comparator 162 is high or low depending on whether the fine control voltage is operating in upper or lower half of its range. To balance the leakage, the receive PLL control logic 164 samples the comparator 162 output. After multiple samples showing upper range operation, the up/down counter is incremented to represent adding charge to the loop filter cap. The up/down counter output is converted to a control voltage by the DAC 166 and low-pass filter 168. The coarse control loop is intended to compensate for manufacturing process and relatively low frequency but large changes due to power supply and temperature drift.

It is preferred that the receive PLL 101 operate from about 1 GHz to about 1.6 GHz across a range of operating conditions, and that it produce six evenly spaced phases. The digital coarse loop is used to compensate for process and temperature to put the receive VCO 150 in the desired operating range. The lower bandwidth analog fine loop is then able to lock to the reference clock and produce six stable 1.0 GHz to 1.6 GHz phases. Other embodiments of the invention (not shown) may have a value range greater or smaller, or covering a different value range; the range described is for illustrative purposes only and in no way limits the application and practice of the invention. The reference level for the comparator 162 is produced by cbias (not shown).

Figure 9:
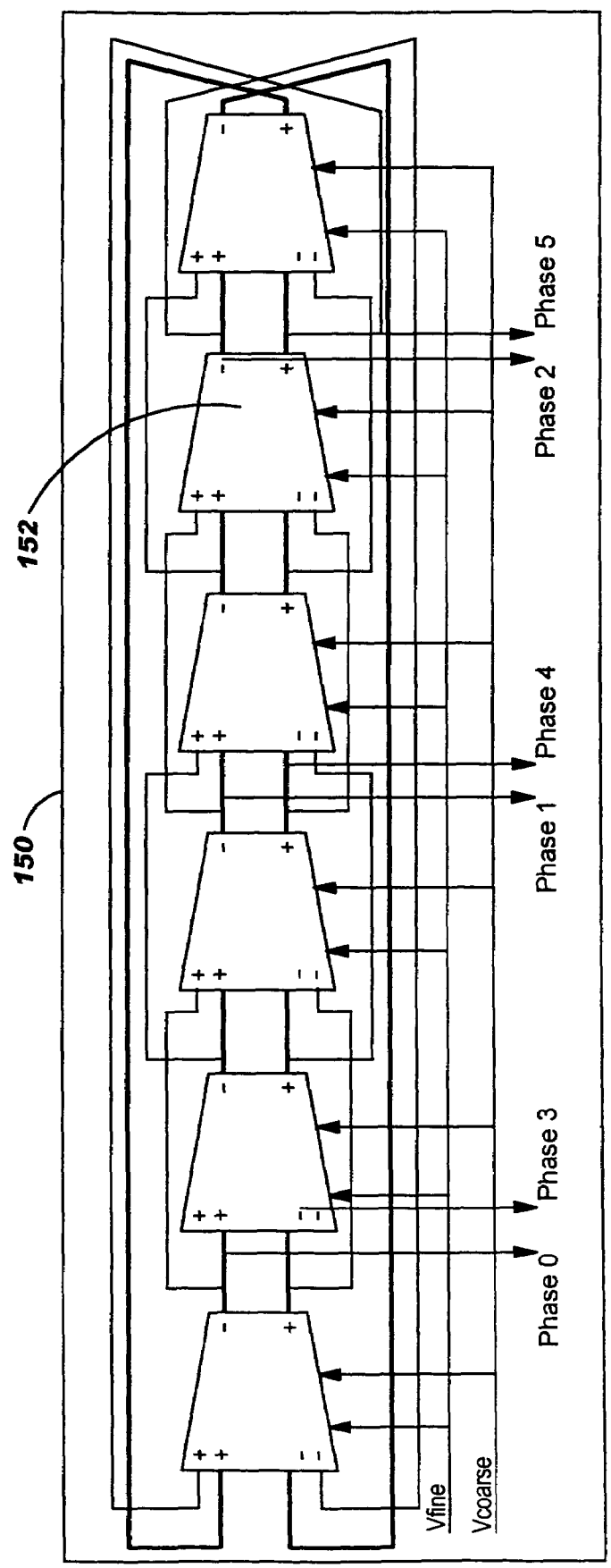
FIG. 9 is a schematic of a receive VCO according to the present invention.

FIG. 9 is a schematic of a receive six-stage VCO 150 structure with dual delay paths according to the present invention, comprising six delay cells 152. The function of the dual delay path oscillator has been previously discussed with respect to the transmit VCO 18 and delay cells 40.

The phase rotator 106 is an analog circuit and, as such, is a device allowing a step by step, glitch-free modulo shift of all n phases of the receive VCO 150 at the input to any phase angle at the output. The modulo option is guaranteeing phase and frequency compensation capability, the glitch-free performance assures that no bits are lost during rotation and 'step by step' means that the amount of phase change is limited to one phase slice for each clock cycle.

The concept of the phase rotator 106 is based on FIR filter principles. The receive VCO 150 may be seen as a circular array of delay elements. By multiplying the outputs t, n of the array with weighting factors m, n and summing the values, an FIR filter is built. The number of taps determine the amount of oversampling and, therefore, the order of an analog filter required for alias filtering. If the weighting factors may be changed dynamically, the FIR filter response may be changed 'on the fly'. This allows the dynamic adjustment of the output phase of such a filter.

It is preferred that the phase rotator 106 receive all six phases from the receive VCO 150 and provide a step by step shift to all six phases to any of 54 possible phase angles at the output. Thus, it will rotate all six phases in 6.67 degree steps which, for a 2.5 Gbit system, corresponds to 14.8 ps. By taking specific weights of each phase, the phase rotator 106 outputs 6 shifted phases. The phases are generated in differential pairs and then passed through three stages of phase buffers 108 before entering the sampling latches 110. Each phase rotator 106 is controlled by 54 lines from logic, which adjust the current weights for each phase contribution.

The receive phase buffers 108 consist of circuits which are designed to interface to the output drive sections (all phases) of the phase rotator circuit 106 while subjecting the phase rotator 106 to only light loading. The phase buffers 108 then drive from the Phase Rotator 106 to the sampling latches 110 while providing the required input drive necessary for the phase rotator circuit 106. It is preferred that the receive phase buffers 108 operate at a rate necessary for a half rate design. It is also preferred that the phase buffers 108 provide adequate rise and fall times taking into account the estimated net loading.

The receive phase buffers 108 may include any circuits that drive clocks from sources to circuits that have high capacitive loading due to wiring and/or gate loading. For the receive PLL 101, it is preferred that the phase buffers 108 allow equal loading on the individual delay stages, and the drive capability to fan out the clock phases from a single PLL to four transmit/receive cores. At the clock rates used in the present embodiment, phase buffers 108 are important in assuring reasonable rise and fall times, duty cycle, and jitter performance of system clocks.

A preferred embodiment of the present invention utilizes two phase buffer 108 circuit topologies. The first is a pseudo-differential positive feedback latching stage referred to as the latch buffer 180, shown in FIG. 10. The second topology is simply a pair of inverters and referred to as the inverter buffer 200, shown in FIG. 11. The two buffer types are used for different applications. For higher power, jitter critical paths, the latch buffer 180 is used because of the circuit's power supply rejection qualities. This includes buffering the differential phases coming out of the receive PLL circuit 101, going into the Phase Rotator 106, and coming out of the Phase Rotator 106. The inverter buffers 200 are used primarily to buffer single ended clocks to logic level circuits, including core logic and sampling latches 110.

Figure 10:
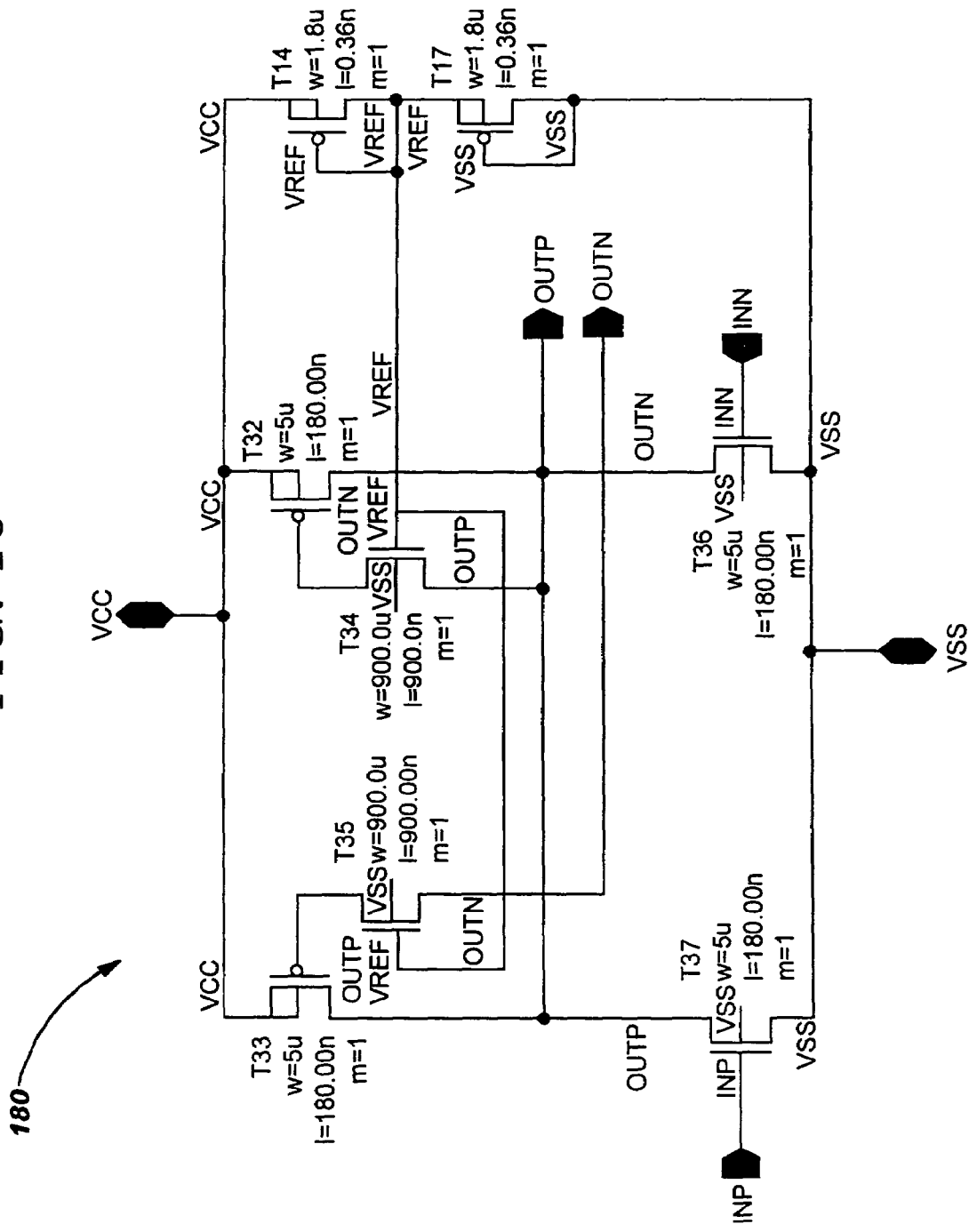
FIG. 10 is a schematic diagram of a latch buffer according to the present invention.

Referring now to FIG. 10, the latch buffer 180 operates with positive feedback through cross-coupling n-channel devices to provide a very fast transition. This is good for avoiding power supply noise because the transition timing is a function of the differential signal coming in. It avoids using just one of the single ended sides to determine when to transition (like an inverter stage would) and, therefore, avoids relying on the supply to be steady. One of the drawbacks of this circuit is the significant DC level of current usage that normal inverters do not have. Another drawback is the lack of a rail to rail output. In the embodiment shown, the p-channel devices are always on, therefore causing the down-level to only approach about 200 mV.

Figure 11:
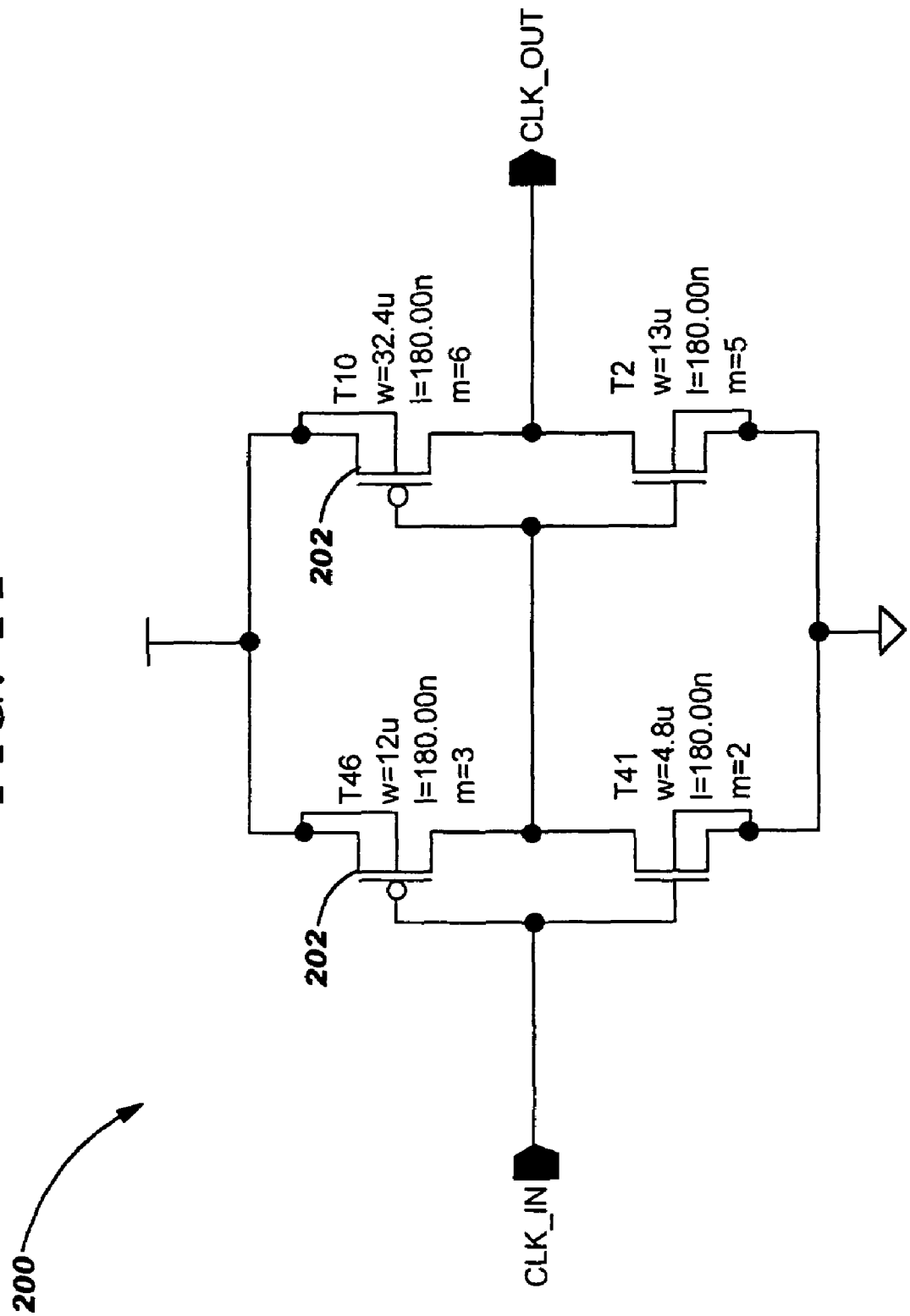
FIG. 11 is a schematic diagram of an inverter buffer according to the present invention.

Referring now to FIG. 11, the inverter buffer 200 relies on using pairs of inverter stages 202 to track mismatches in p- to n-channel devices. This greatly improves jitter performance through the inverter stages 202. Whenever the inverter buffer 200 is used to ramp up the driving capability of a circuit, the general rule of exponentially increasing inverter sizes by the power of "e" was used. This keeps rise and fall times consistent through all stages of inverter chains. And since jitter is basically a linear function of rise and fall time, this prevented excessive jitter at any one stage.

To maintain the duty-cycle of the clocks, the ratio of p- to n-channel was selected in the embodiment shown in FIG. 11 to be 2.5 in order to match the approximate drive mismatch of the two devices in 7SF. It is preferred that the inverters are sized at a minimal length to maximize speed performance.

The Phase Buffers 108 characteristics are measured primarily by power usage and jitter. In most cases, it is preferential to trade off increased power usage for better jitter performance. Table 6 illustrates jitter and power numbers for exemplary embodiments of the Phase Buffers 72 and 108. The simulated jitter numbers were based on power supply noise. For the transmit Phase Buffers 72, the noise level was 75 mVp-p. For the receive Phase Buffers 108, the noise level was 150 mVp-p. All numbers are for 2.5 Gbps operation, on a per link basis.

TABLE 6

XMT and RCV Phase Buffer Performance (at 2.5 Gbps)

| Test Conditions | POWER SPEC | POWER SIM | JITTER SPEC | JITTER SIM |
|---|---|---|---|---|
| RCV PB, ASICBC, 1.98 V VCC, 0 C. | 6.6 mW | 13.2 mW | 8 ps PP | 1.2 ps PP |
| RCV PB, TYP, 1.8 V VCC, 62.5 C. |  | 9.2 mW |  | 2.6 ps PP |
| RCV PB, ASICWC, 1.62 V VCC, 125 C. |  | 6.3 mW |  | 5.2 ps PP |
| XMT PB, ASICBC, 1.96 V VCC, 0 C. | 1.8 mW | 6.8 mW | 8 ps PP | 6.8 ps PP |
| XMT PB, TYP, 1.8 V VCC, 62.5 C. |  | 4.9 mW |  | 14.4 ps PP |
| XMT PB, ASICWC, 1.62 V VCC, 125 C. |  | 3.9 mW |  | 18.5 ps PP |

Referring now to FIG. 14, a block diagram of the topography of an embodiment of the phase rotator circuits 106, associated cbias circuits 107 and phase buffer circuits 108 according to the present invention are shown. The phase rotator 106 comprises phase rotator currents buffer circuits 210, phase rotator current circuits 212 and phase rotator core circuits 214. The phase buffer circuits 108 comprise phase buffer core circuits 218 and phase buffer post-buffer circuits 220. The phase rotator circuits 106, associated cbias circuits 107 and phase buffer circuits 108 are more fully described in U.S. patent application Ser. No. 09/861,668, filed May 22, 2001, by Schmatz, entitled "Phase Rotator and Data Recovery Receiver Incorporating said Phase Rotator", the entire disclosure of which has been previously incorporated. Schematic exemplary diagrams of elements of FIG. 14 have been provided as follows.

Figure 15:
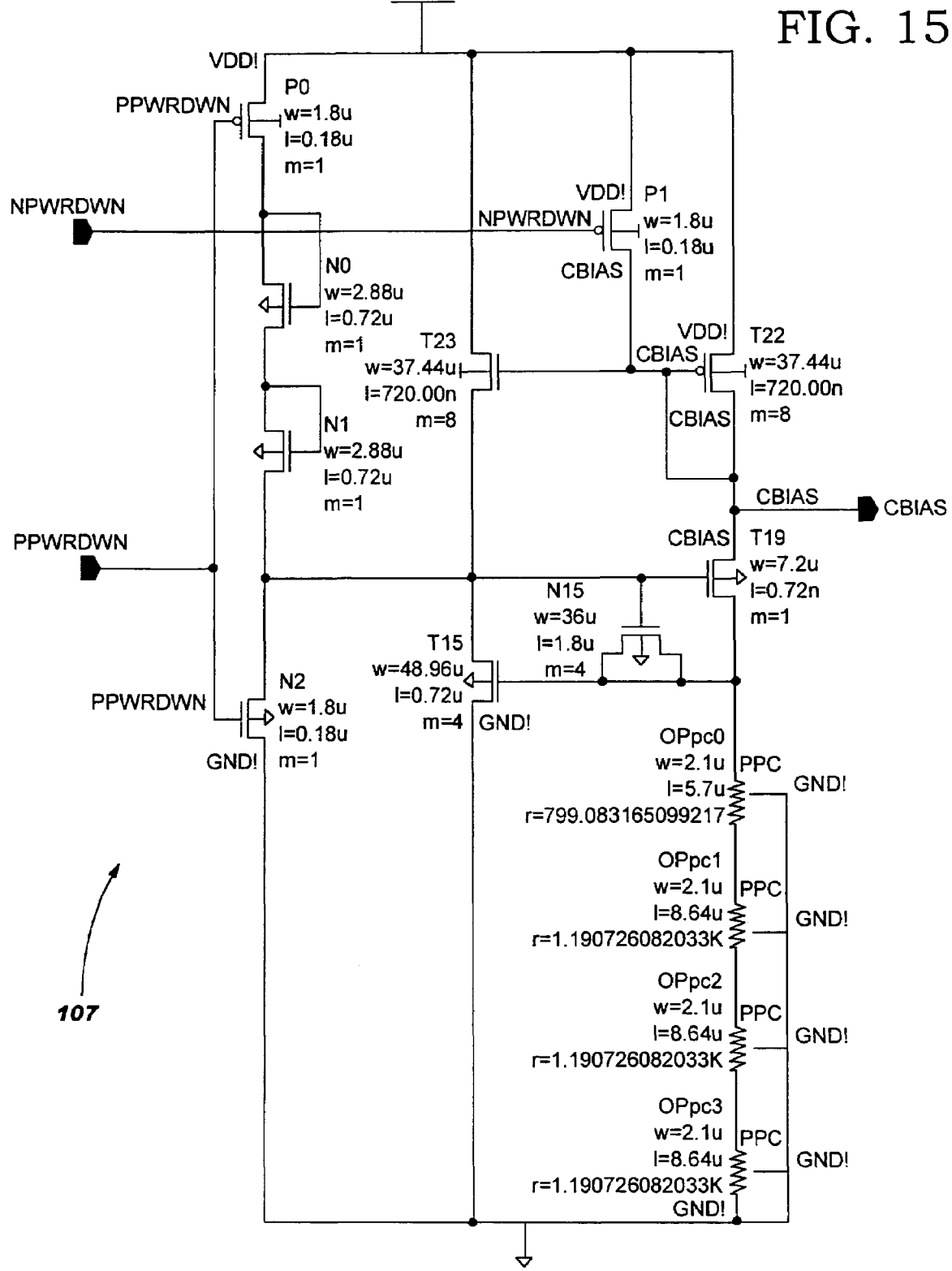
FIG. 15 is a schematic diagram of a phase rotator cbias according to the present invention.

FIG. 15 provides an exemplary schematic diagram of the phase rotator cbias circuit 107.

Figure 16:
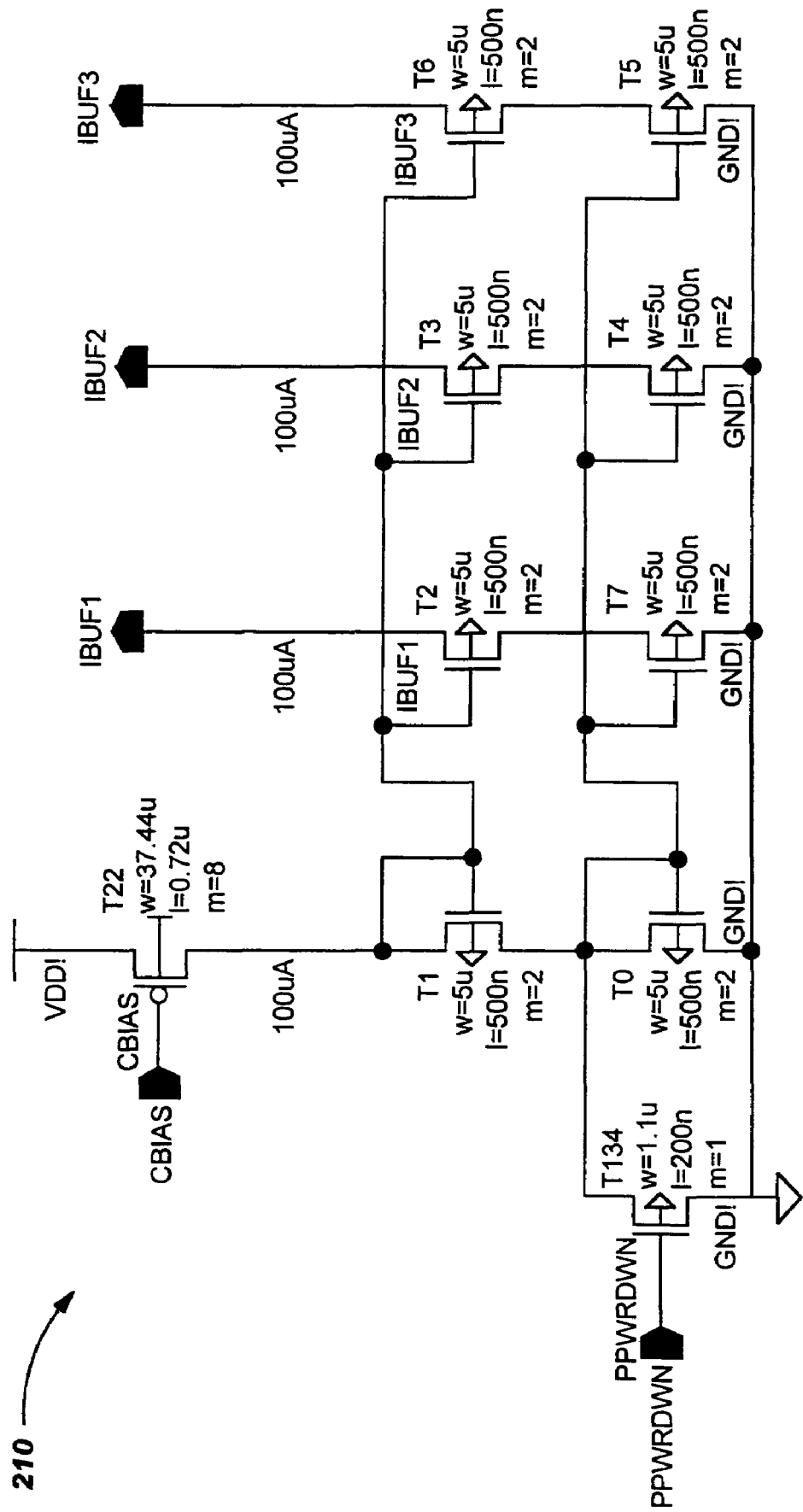
FIG. 16 is a schematic diagram of a phase rotator currents buffer according to the present invention.

FIG. 16 provides an exemplary schematic diagram of the phase rotator currents buffer circuit 210.

Figures 18, 18A:
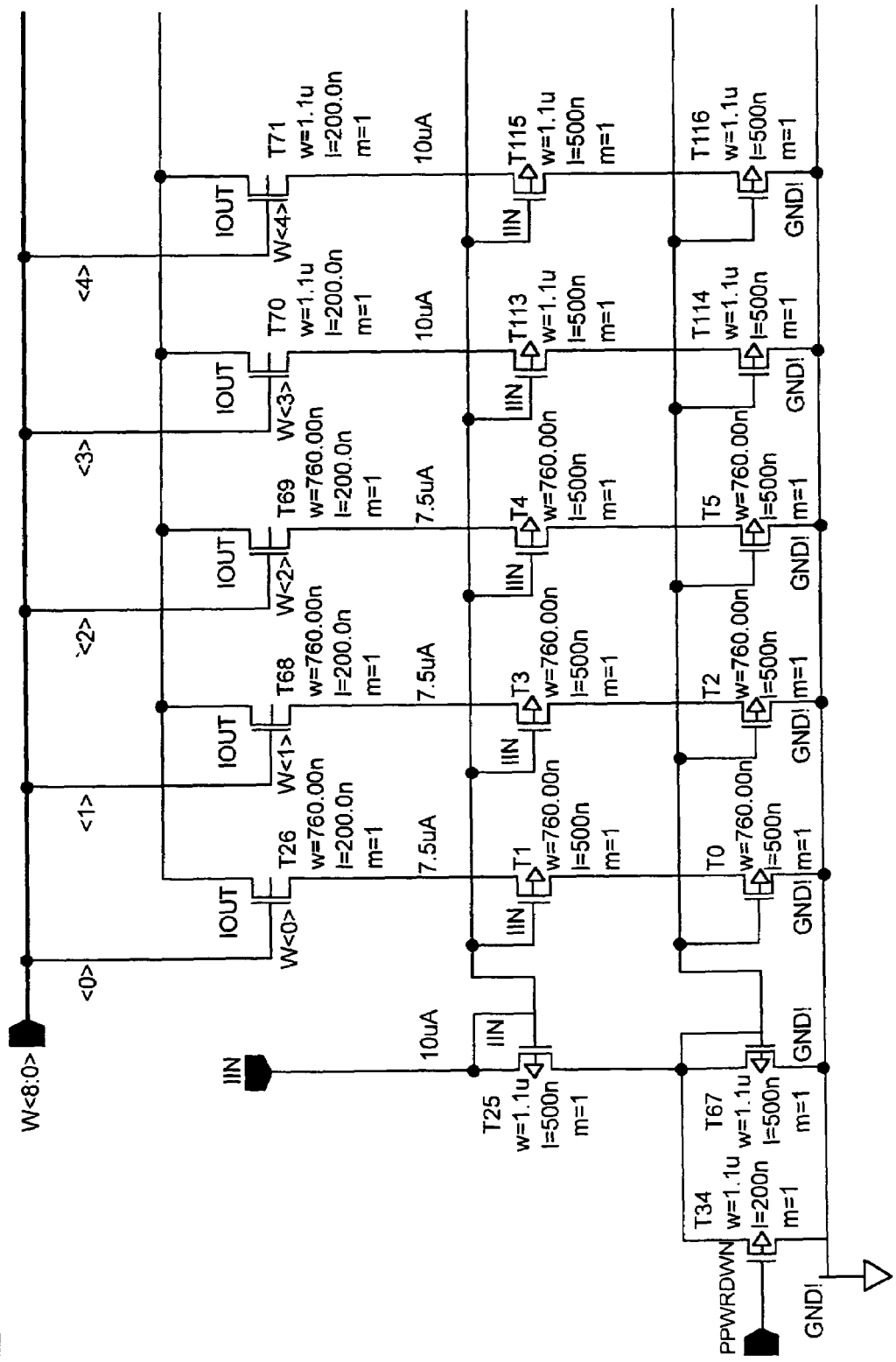
FIGS. 18A–B, thereafter
FIG. 18, is a schematic diagram of a phase rotator currents buffer array according to the present invention.
Figure 18B:
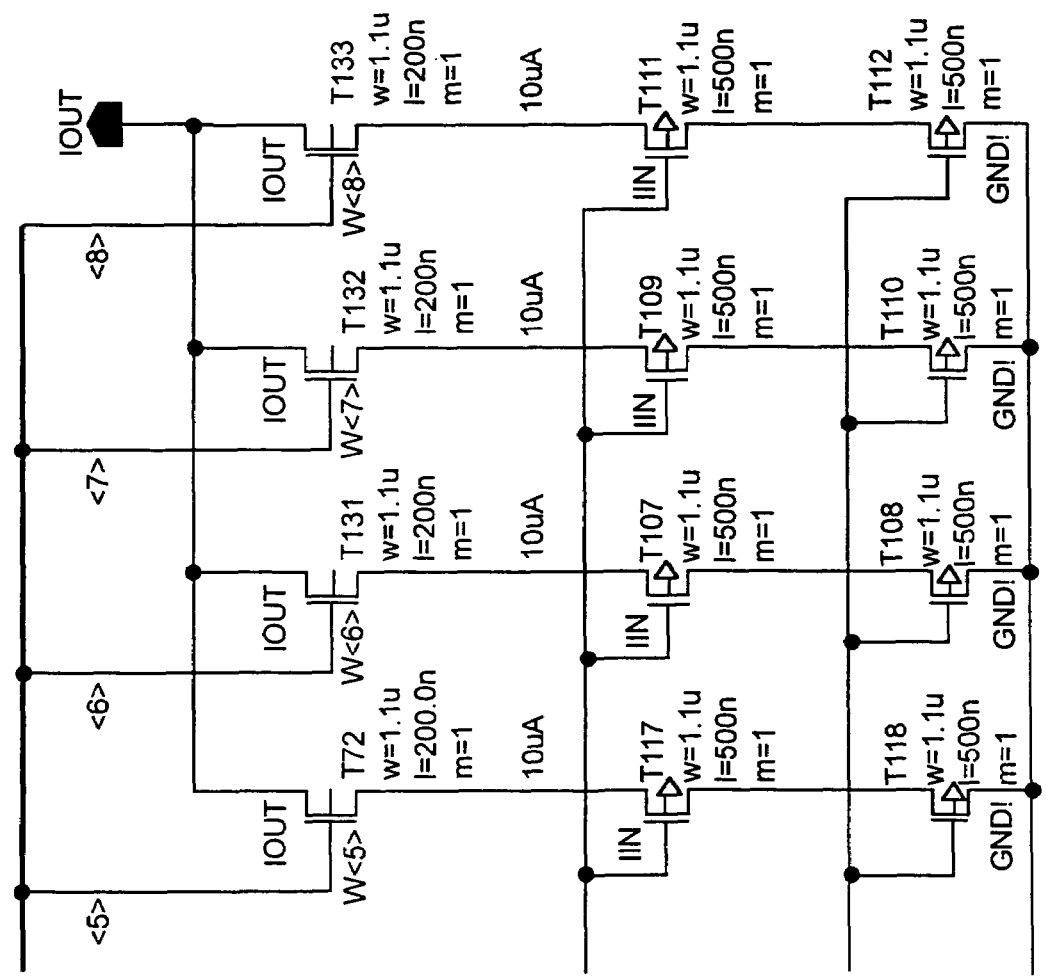

FIG. 18 provides an exemplary schematic diagram of the phase rotator currents buffer circuit 212.

Figure 20:
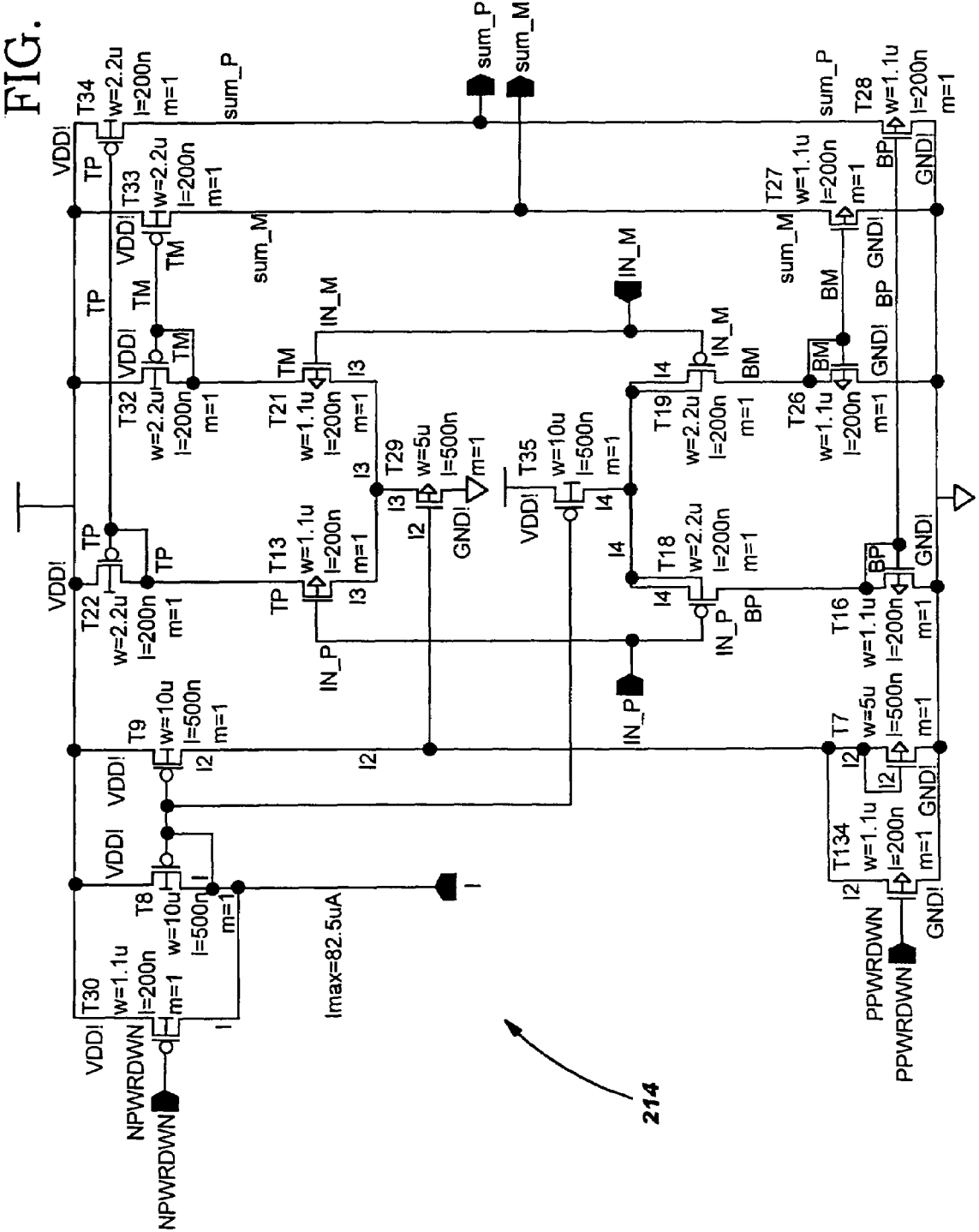
FIG. 20 is a schematic diagram of a phase rotator core circuit according to the present invention.

FIG. 20 provides an exemplary schematic diagram of the phase rotator core circuit 214.

Figure 21:
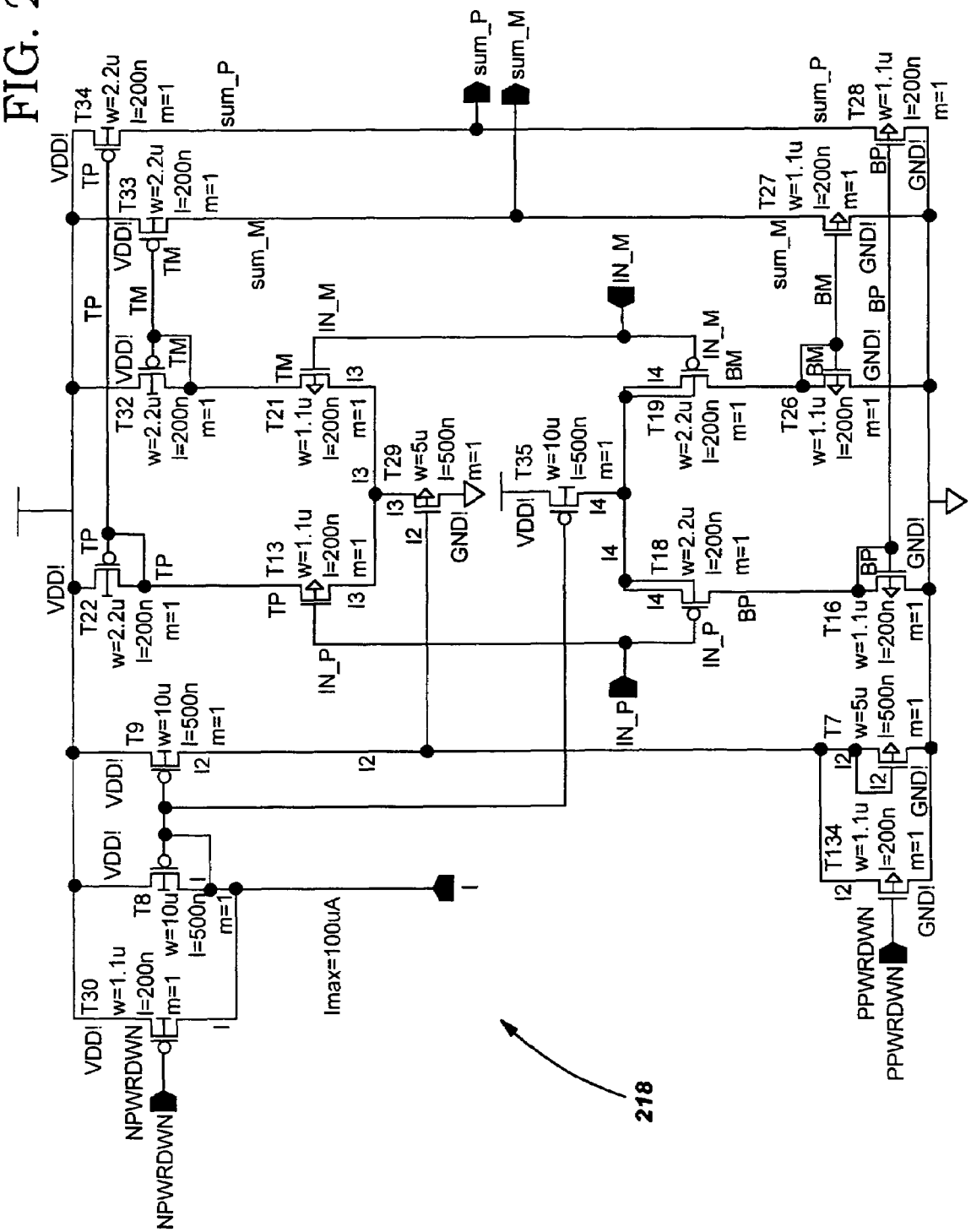
FIG. 21 is a schematic diagram of a phase rotator core buffer circuit according to the present invention.
Figure 22:
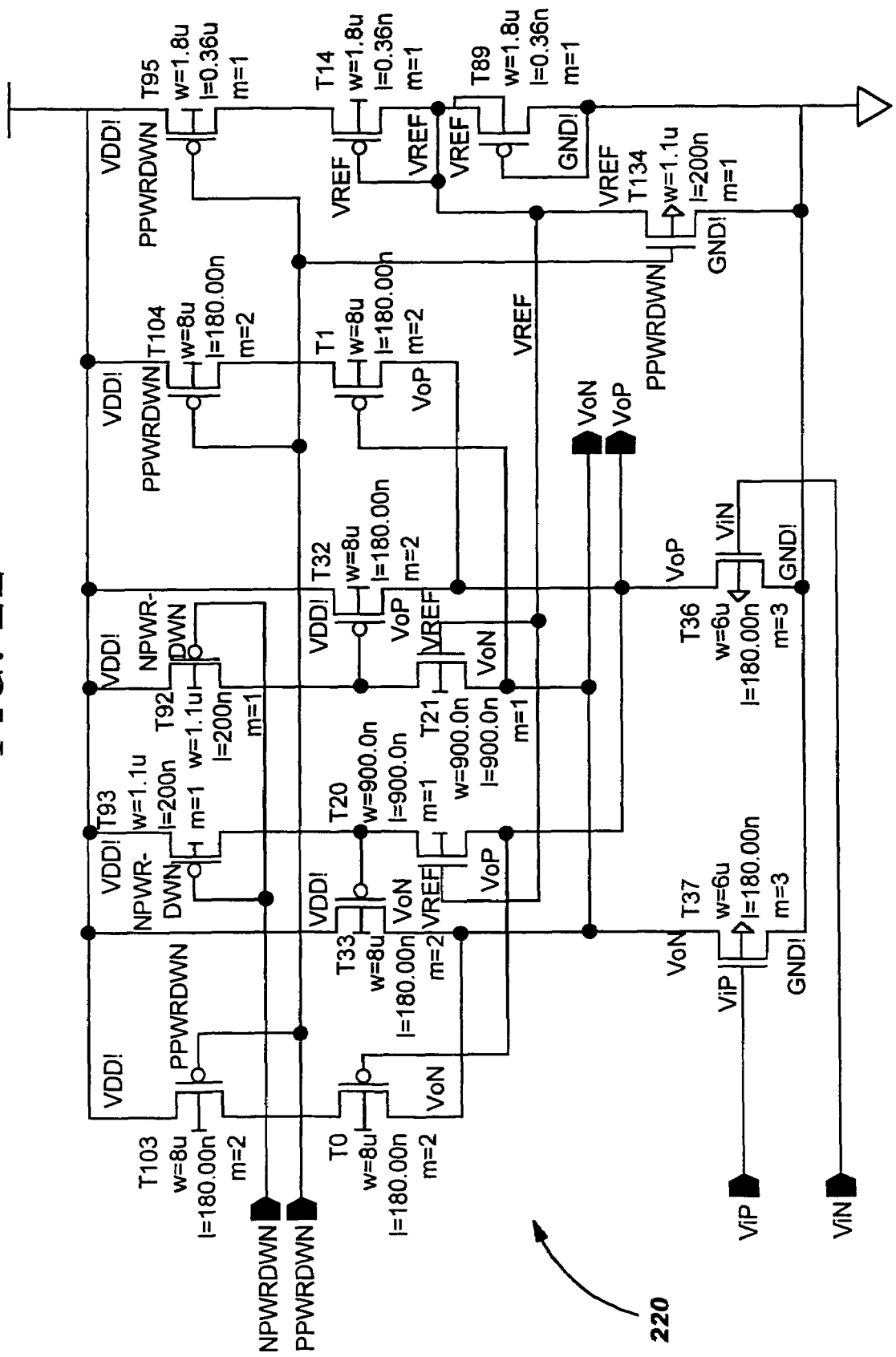
FIG. 22 is a schematic diagram of a phase rotator core buffer post-buffer circuit according to the present invention.

And with respect to the phase buffer circuits 108, FIG. 21 provides an exemplary schematic diagram of the phase rotator buffer core circuit 218, and FIG. 22 provides an exemplary schematic diagram of the phase rotator buffer post-buffer circuit 220.

Block diagrams have also been provided to more clearly illustrate phase rotator 106 and phase buffer circuitry 108.

Figure 17:
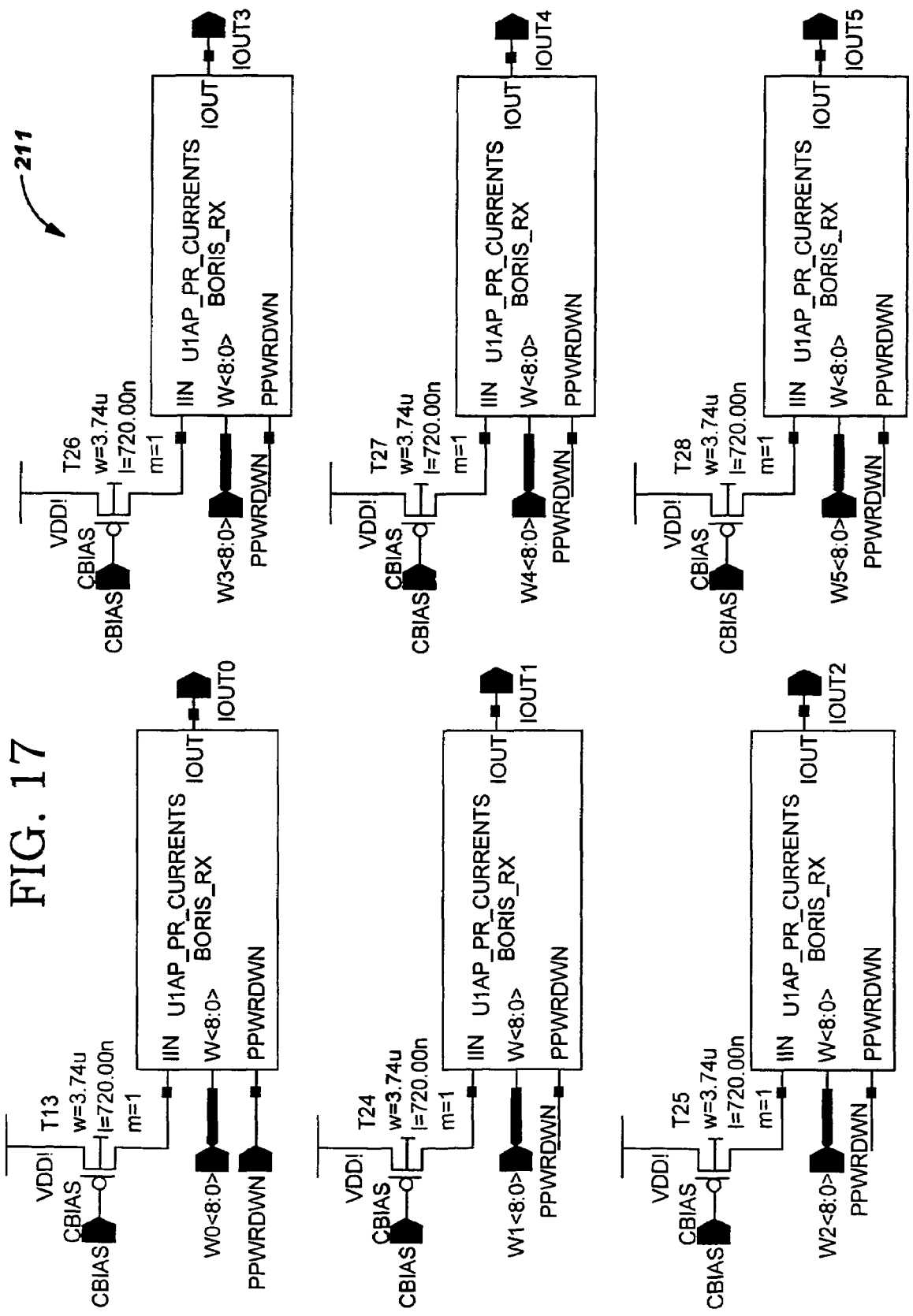
FIG. 17 is a block diagram of a phase rotator currents buffer six pack according to the present invention.

FIG. 17 is a block diagram of a phase rotator currents buffer 210 six pack 211.

Figure 19:
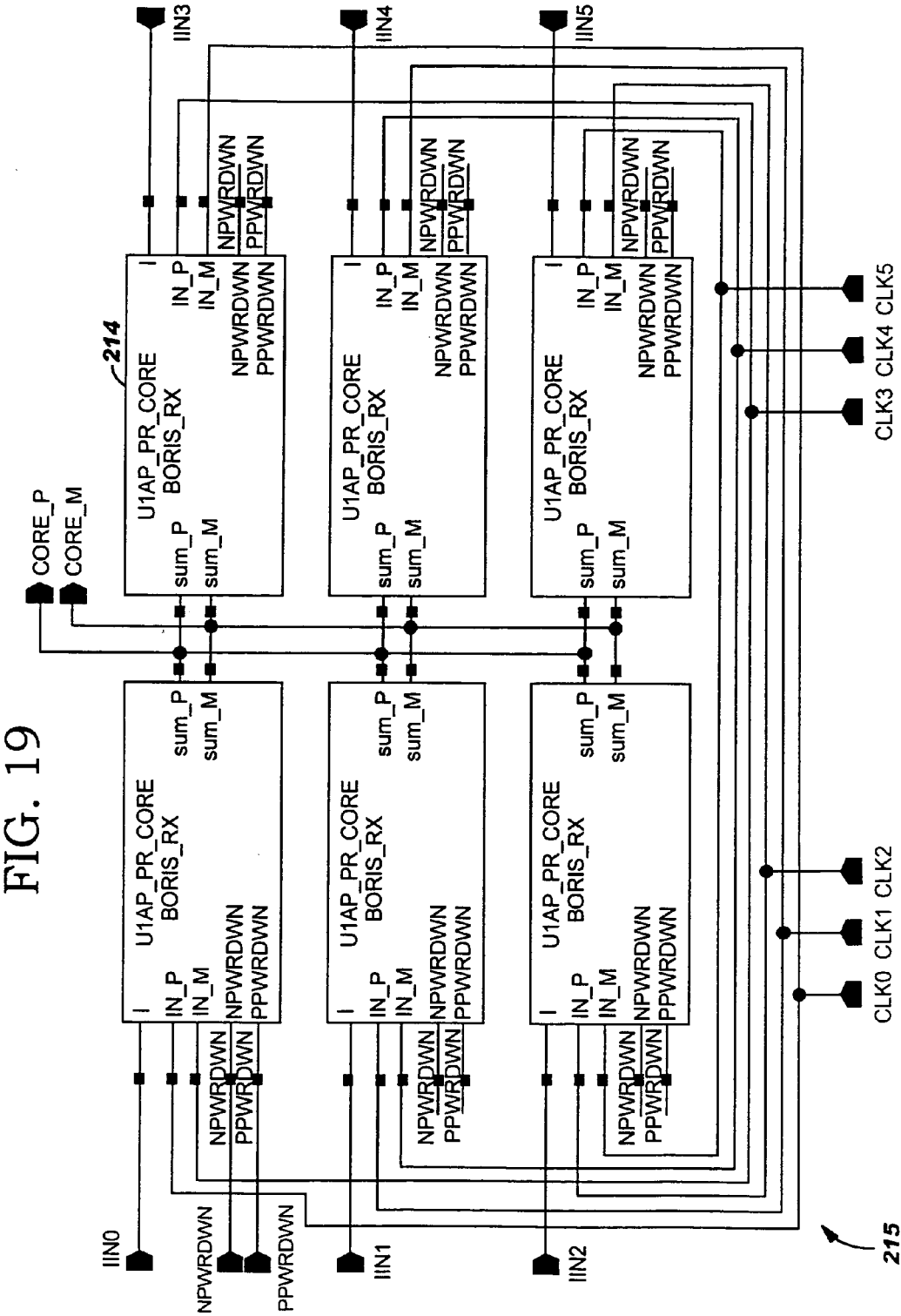
FIG. 19 is a block diagram of a phase rotator core circuit six pack according to the present invention.

FIG. 19 is a block diagram of a phase rotator core circuit 214 six pack 215.

Figure 23:
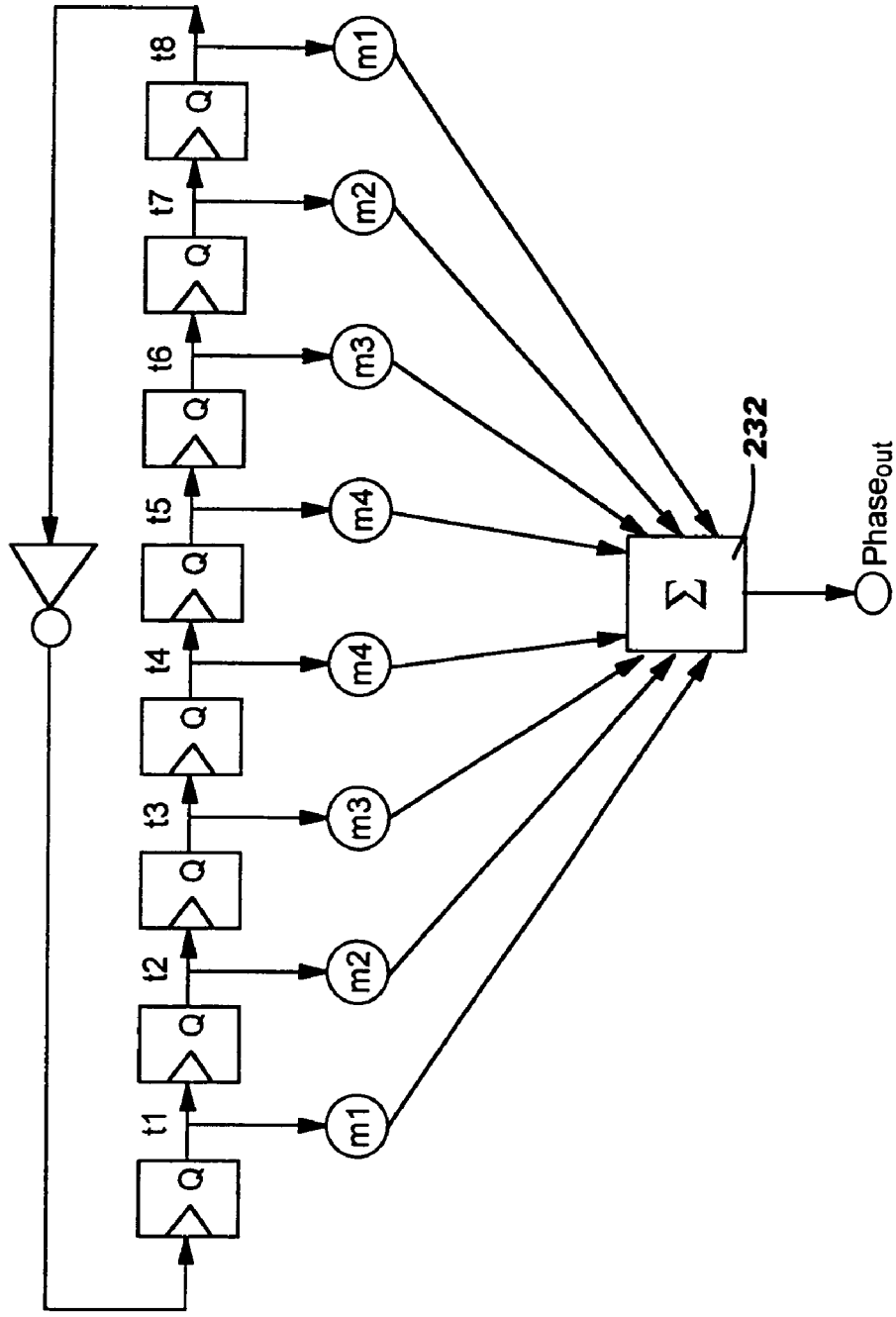
FIG. 23 is a block diagram of another embodiment of the present invention featuring a basic FIR filter approach with an eight stage/phase ring oscillator.

FIG. 23 shows another embodiment of the present invention featuring a basic FIR filter 232 approach with eight taps t1 to t8 from an eight stage/phase ring oscillator 230. Five different weighting factors m0 to m4 are assumed to be available, and they are built by summing sub-factors w1 to w4. Table 1 shows the initial configuration for the weighting factors.

TABLE 1

Configuration of the weighting factors
m0 to m4 from sub-factors w1 to w4

| Weighting factor | Configuration |
|---|---|
| m0 | = 0 (not used in initial configuration) |
| m1 | = w1 |
| m2 | = w1 + w2 |
| m3 | = w1 + w2 + w3 |
| m4 | = w1 + w2 + w3 + w4 |

Figure 24:
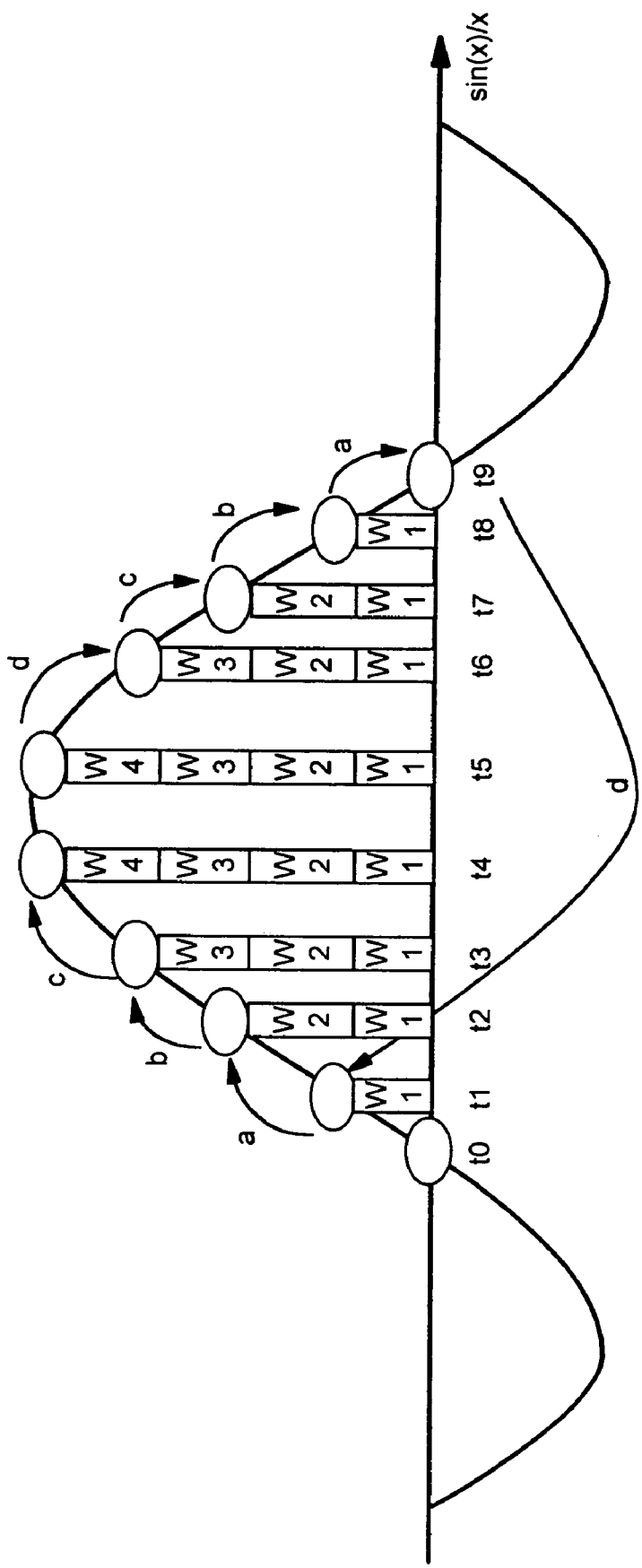
FIG. 24 is a graphical representation of the stepwise change of output phase by a phase rotator according to the present invention.

FIG. 24 shows the stepwise change of output phase by sequentially changing the weighting factors that determine the contribution from each phase tap to the actual output. In step (a), for example, the weighting factor at tap t1 is changed from w1 to w1+w2 and, at the same time, the weight at tap t8 is changed to zero. For a 'clever' setting of the weight values w1 to w4, this will shift the output phase by exactly one-fourth of a phase slice. After the last rotating step (d), all weights have been shifted by one tap position. This corresponds to a shift of one phase slice at the output of the FIR.

By repetition of the above sequence, any phase setting may be tuned in. Because this is a circular operation, the range of the output phase is not limited to the 0 to 360 degree interval. This allows a continuous variation of the phase and thereby a frequency adjustment. Due to the fact that the weighting factors are only changed by adding or subtracting one sub-factor element at a time, no glitches can occur.

Figure 25:
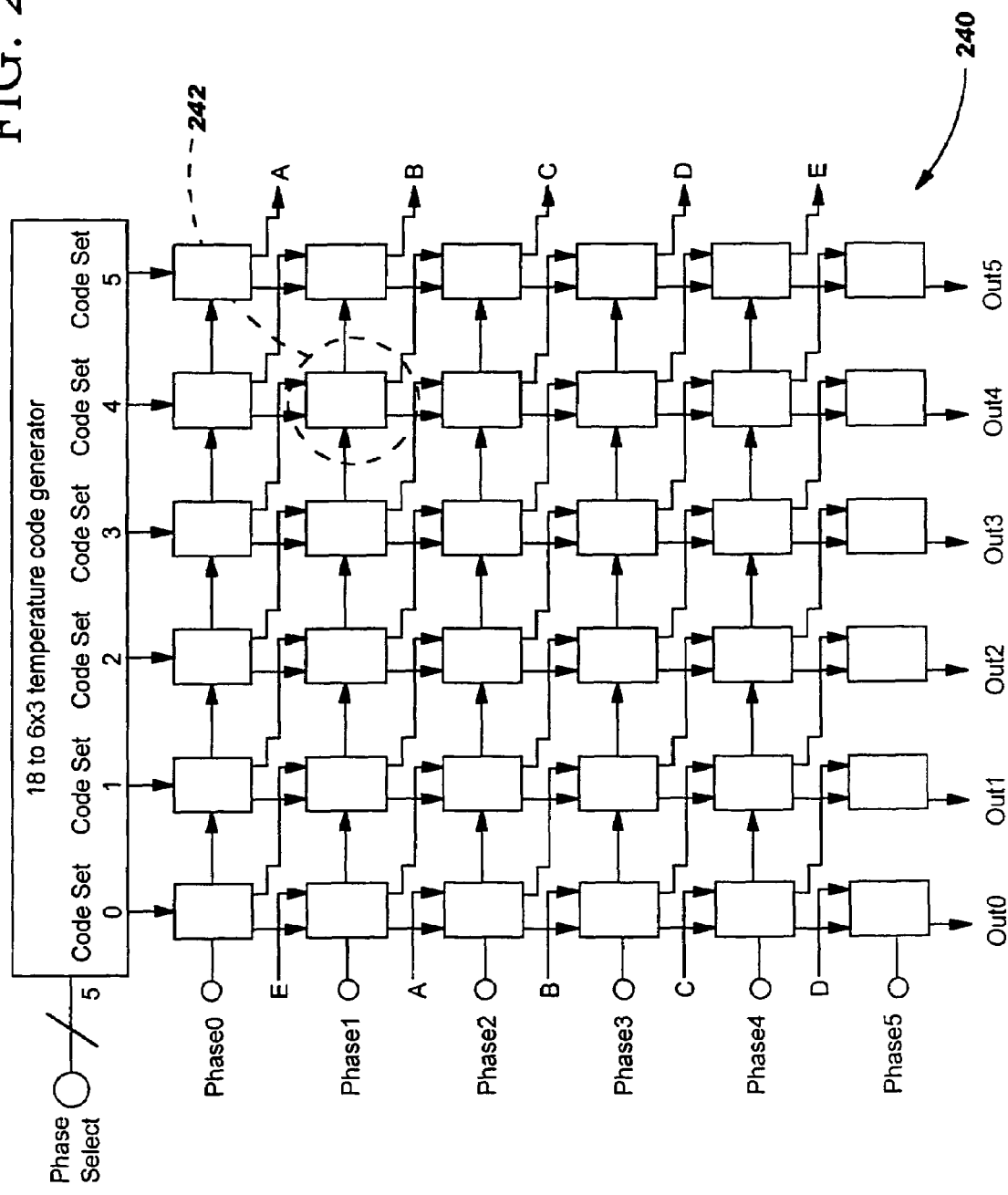
FIG. 25 is a simplified schematic for a six phase version of a phase rotator according to the present invention.

A simplified schematic for a six-phase phase rotator 240 according to the present invention is provided in FIG. 25. With six-phase slices, four possible weighting factors m0 to m3 are built by variable summation of the three sub-factors w0 to w2. A temperature code logic generates the control signals for the wired summation of currents. This allows the generation of eighteen phase steps for one 360 degree rotation from a three stage differential ring oscillator. The output of the FIR blocks are preferably summed by a wired n-function. In order to generate high quality clock signals, it is preferred that differential clock buffers are used.

Figure 26:
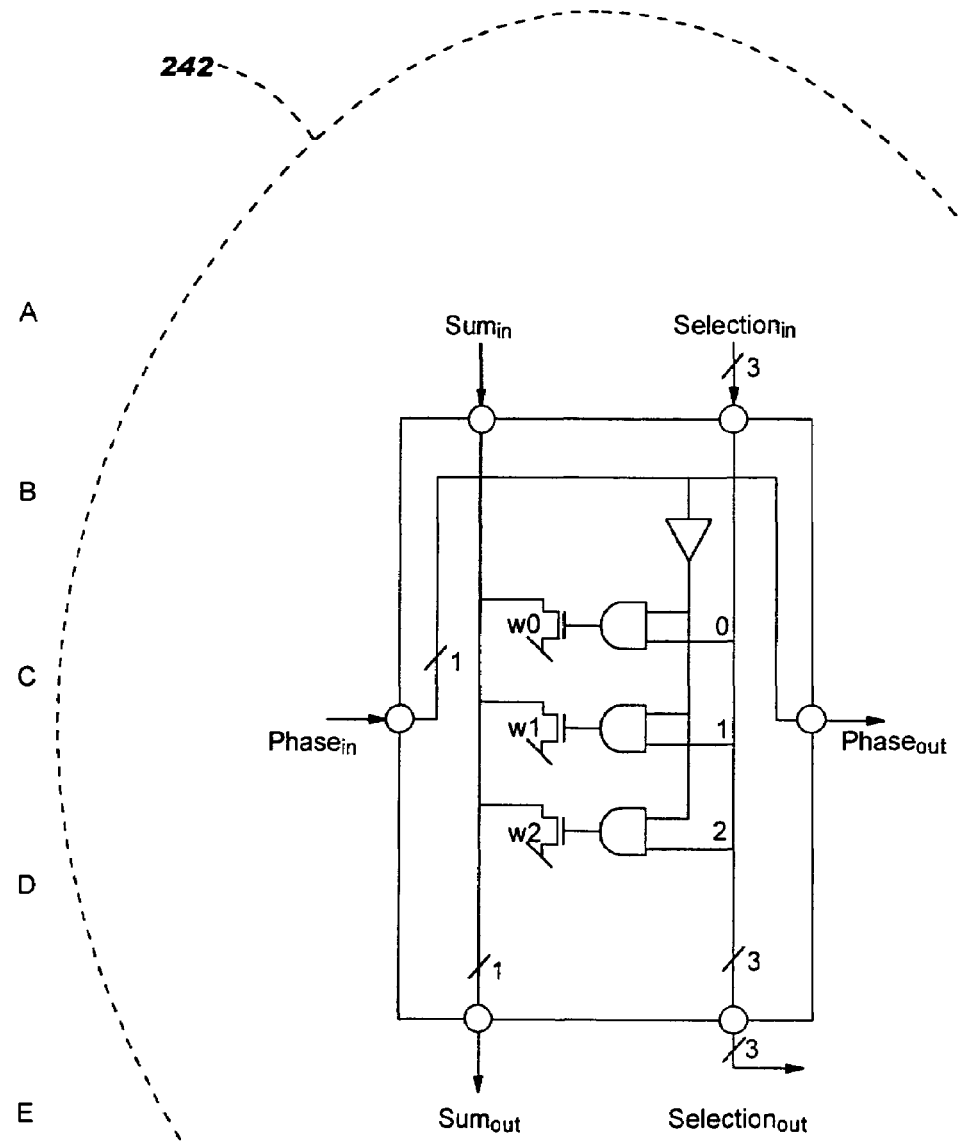
FIG. 26 provides a detail view of one of a circuit block of the phase rotator of FIG. 25.

FIG. 26 provides a detail view of one of the phase rotator circuit blocks 242.

While preferred embodiments of the invention has been described herein, variations in the design may be made, and such variations may be apparent to those skilled in the art of making tools, as well as to those skilled in other arts. The performance and signal specifications identified above are by no means the only specifications suitable for the method and system of the present invention, and substitute specifications will be readily apparent to one skilled in the art. The scope of the invention, therefore, is only to be limited by the following claims.

What is claimed is:

1. A unified serial link system comprising a transmitter portion and a receiver portion, one of said transmitter portion and said receiver portion comprising a phase locked loop circuit control loop, the circuit control loop comprising:
   a voltage control oscillator configured to generate a voltage control oscillator signal and a phase locked loop output signal responsive to a control voltage signal;
   a frequency divider connected to the voltage control oscillator to receive the voltage control oscillator signal, the frequency divider configured to generate a frequency divider output;
   a phase-frequency detector connected to the frequency divider and configured to receive the frequency divider output and generate a phase-frequency detector output;
   a charge pump connected to the phase-frequency detector and configured to receive the phase-frequency detector output and generate a charge pump output; and
   a multi-pole loop filter connected to the charge pump and the voltage control oscillator, the multi-pole loop filter configured to receive the charge pump output and generate the control voltage signal to the voltage control oscillator;
   wherein the voltage control oscillator is further configured to generate the voltage control oscillator signal and the phase locked loop output signal responsive to a coarse control voltage signal, and the phase locked loop control circuit further comprises a coarse loop, said coarse loop comprising:
   a voltage comparator connected to the multi-pole loop filter and configured to receive the control voltage signal;
   a reference generator connected to the voltage comparator and configured to generate a reference signal; wherein said voltage comparator generates a comparator output from the control voltage signal and the reference signal;
   a phase locked loop control logic circuit connected to the comparator configured to sample the comparator output and generate a control logic output;
   a digital to analog converter connected to the phase locked loop control logic circuit and configured to receive the control logic output and generate a control voltage output; and
   a low pass filter connected to the digital to analog converter and to the voltage control oscillator and configured to receive the control voltage output and generate the coarse control voltage signal.

2. A unified serial link system comprising a transmitter portion and a receiver portion, the transmitter portion comprising a dual-loop phase locked loop circuit control loop, the circuit control loop comprising:
   a first loop voltage control oscillator configured to generate a first loop voltage control oscillator signal and a phase locked loop output signal responsive to a control voltage signal;
   a first loop frequency divider connected to the first loop voltage control oscillator to receive the first loop voltage control oscillator signal, the first loop frequency divider configured to generate a first loop frequency divider output;
   a first loop phase-frequency detector connected to the first loop frequency divider and a second loop frequency divider and configured to receive the first loop frequency divider output and a second loop frequency divider output and generate a first loop phase-frequency detector output;
   a first loop charge pump connected to the first loop phase-frequency detector and configured to receive the first loop phase-frequency detector output and generate a first loop charge pump output;
   a first loop multi-pole loop filter connected to the first loop charge pump and the first loop voltage control oscillator, the first loop multi-pole loop filter configured to receive the first loop charge pump output and generate the first loop control voltage signal to the first loop voltage control oscillator;
   a second loop phase-frequency detector connected to the second loop frequency divider and configured to receive the second loop frequency divider output and generate a second loop phase-frequency detector output;
   a second loop charge pump connected to the second loop phase-frequency detector and configured to receive the second loop phase-frequency detector output and generate a second loop charge pump output;
   a second loop multi-pole loop filter connected to the second loop charge pump and configured to receive the second loop charge pump output and generate a second loop voltage signal;
   a LC oscillator connected to the second loop multi-pole loop filter and configured to generate a LC signal to the second loop frequency divider and the first loop phase-frequency detector responsive to the second loop multi-pole loop filter voltage signal;
   a transmitter phase buffer circuit connected to the circuit control loop and configured to receive and re-power the phase locked loop output signal; and
   a transmitter finite impulse response equalization driver circuit connected to said phase buffer circuit to receive said re-powered phase locked loop output signal.

3. A unified serial link system comprising a transmitter portion and a receiver portion, said receiver portion comprising a phase locked loop circuit control loop, the circuit control loop comprising:
   a voltage control oscillator configured to generate a voltage control oscillator signal and a phase locked loop output signal responsive to a control voltage signal;
   a frequency divider connected to the voltage control oscillator to receive the voltage control oscillator signal, the frequency divider configured to generate a frequency divider output;
   a phase-frequency detector connected to the frequency divider and configured to receive the frequency divider output and generate a phase-frequency detector output;
   a charge pump connected to the phase-frequency detector and configured to receive the phase-frequency detector output and generate a charge pump output;
   a multi-pole loop filter connected to the charge pump and the voltage control oscillator, the multi-pole loop filter configured to receive the charge pump output and generate the control voltage signal to the voltage control oscillator;
   a receiver phase rotator circuit coupled to the receiver phase locked loop control circuit; and
   a receiver phase buffer circuit connected to the receiver phase rotator circuit;
   wherein the receiver phase rotator circuit is configured to acquire a clock phase from the receiver phase locked loop control circuit and modulo shift the clock phase into a desired phase angle.

4. The unified serial link system of claim 3 wherein the phase buffer circuit is a latch buffer configured with positive feedback through cross-coupled n-channels devices.

5. The unified serial link system of claim 3 wherein the phase buffer circuit comprises a pair of inverters.

6. The unified serial link system of claim 4 wherein the latch buffer comprises at least one CMOS, positive edge triggered latch circuit sampling latch.

7. A unified serial link system comprising a transmitter portion and a receiver portion, one of said transmitter portion and said receiver portion comprising a phase locked loop circuit control loop, the circuit control loop comprising:
- a voltage control oscillator configured to generate a voltage control oscillator signal and a phase locked loop output signal responsive to a control voltage signal;
- a frequency divider connected to the voltage control oscillator to receive the voltage control oscillator signal, the frequency divider configured to generate a frequency divider output;
- a phase-frequency detector connected to the frequency divider and configured to receive the frequency divider output and generate a phase-frequency detector output;
- a charge pump connected to the phase-frequency detector and configured to receive the phase-frequency detector output and generate a charge pump output; and
- a multi-pole loop filter connected to the charge pump and the voltage control oscillator, the multi-pole filter comprising a ripple capacitor configured to attenuate charge pump ripple and a loop filter capacitor configured to stabilize the charge pump output and set a dominant pole, the multi-pole loop filter configured to receive the charge pump output and generate the control voltage signal to the voltage control oscillator.

8. The unified serial link system of claim 7, wherein the voltage control oscillator further comprises a plurality of tunable delay cells, said delay cells configured to have a tunable delay of from about 80 ps to about 125 ps.

9. A method for a unified serial link, comprising the steps of: transmitting or receiving by phase locked loop steps, said phase locked loop steps comprising the steps of:
- generating a voltage control oscillator signal and a phase locked loop output signal responsive to a control voltage signal and a coarse control voltage signal;
- generating a frequency divider output responsive to the voltage control oscillator signal;
- generating a phase-frequency detector output responsive to the frequency divider output;
- generating a charge pump output responsive to the phase-frequency detector output;
- generating the control voltage signal by filtering the charge pump output;
- generating a voltage comparator output by comparing the control voltage signal and a reference signal;
- generating a control logic output responsive to the comparator output;
- converting the control logic output into a control voltage output; and
- generating the coarse control voltage signal by filtering the control voltage output.

10. A method for a unified serial link, comprising the steps of transmitting by phase locked loop steps, said phase locked loop steps comprising the steps of:
- generating a first voltage control oscillator signal and a phase locked loop output signal responsive to a control voltage signal;
- generating a first frequency divider output responsive to the first voltage control oscillator signal;
- generating a second frequency divider output from an LC signal;
- generating a second phase-frequency detector output detector responsive to the second frequency divider output;
- generating a second charge pump output responsive to the second phase-frequency detector output;
- generating a second voltage signal by filtering the second charge pump output;
- generating the LC signal responsive to the second voltage signal;
- generating a first phase-frequency detector output responsive to the first frequency divider output and the second frequency divider output;
- generating a first charge pump output responsive to the first phase-frequency detector output;
- generating the first control voltage signal responsive to the first charge pump output;
- re-powering the phase locked loop output signal; and
- equalizing the re-powered phase locked loop output signal.

11. A method for a unified serial link, comprising the steps of: receiving by phase locked loop steps, said phase locked loop steps comprising the steps of:
- generating a voltage control oscillator signal and a phase locked loop output signal responsive to a control voltage signal;
- generating a frequency divider output responsive to the voltage control oscillator signal;
- generating a phase-frequency detector output responsive to the frequency divider output;
- generating a charge pump output responsive to the phase-frequency detector output;
- generating the control voltage signal responsive to the charge pump output;
- acquiring a clock phase from the phase locked loop output signal;
- modulo shifting the clock phase into a desired phase angle output; and
- buffering the phase angle output.

12. The method of claim 11 wherein the step of buffering the phase angle output comprises using a latch buffer, further comprising the step of configuring the latch buffer with positive feedback through cross-coupled n-channel devices.

13. The method of claim 11 wherein the step of buffering the phase angle output comprises using a pair of inverters.

14. The method of claim 12 wherein the step of using a latch buffer comprises using at least one CMOS, positive edge triggered latch circuit sampling latch.

15. A method for a unified serial link, comprising the steps of: transmitting or receiving by phase locked loop steps, said phase locked loop steps comprising the steps of:
- generating a voltage control oscillator signal and a phase locked loop output signal responsive to a control voltage signal;
- generating a frequency divider output responsive to the voltage control oscillator signal;
- generating a phase-frequency detector output responsive to the frequency divider output;
- generating a charge pump output responsive to the phase-frequency detector output;
- generating the control voltage signal responsive to the charge pump output by attenuating charge pump ripple; and stabilizing the charge pump output and setting a dominant pole.

16. The method of claim 15, wherein the step of generating the voltage control oscillator signal and the phase locked loop output signal comprises using a plurality of tunable delay cells, further comprising the step of tuning said delay cells to a delay of from about 80 ps to about 125 ps.

* * * * *